US007248653B2

(12) United States Patent
Wieck

(10) Patent No.: US 7,248,653 B2
(45) Date of Patent: *Jul. 24, 2007

(54) LOW POWER AND HIGH LINEARITY RECEIVERS WITH REACTIVELY BIASED FRONT ENDS

(75) Inventor: Christopher P. Wieck, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 649 days.

This patent is subject to a terminal disclaimer.

(21) Appl. No.: 10/409,298

(22) Filed: Apr. 7, 2003

(65) Prior Publication Data

US 2003/0174793 A1 Sep. 18, 2003

Related U.S. Application Data

(63) Continuation of application No. 09/753,123, filed on Dec. 29, 2000, now Pat. No. 6,625,238, which is a continuation-in-part of application No. 09/538,606, filed on Mar. 29, 2000, now Pat. No. 6,782,062.

(51) Int. Cl.
    *H04L 27/08* (2006.01)
(52) U.S. Cl. ................ 375/345; 375/317; 375/319; 375/316
(58) Field of Classification Search ............ 375/345, 375/317, 318, 319, 219, 316; 330/285, 135, 330/136, 140, 141
See application file for complete search history.

(56) References Cited

U.S. PATENT DOCUMENTS 5,159,288 A * 10/1992 Ito .............................. 330/289
5,513,386 A    4/1996 Ogino et al.
5,712,593 A    1/1998 Buer et al.
(Continued)

FOREIGN PATENT DOCUMENTS

JP     409-107299 A    4/1997
(Continued)

OTHER PUBLICATIONS

U.S. Appl. No. 09/538,606, filed Mar. 29, 2000, Wieck.
(Continued)

*Primary Examiner*—Phuong Phu
(74) *Attorney, Agent, or Firm*—Fitch, Even, Tabin & Flannery

(57) ABSTRACT

A radio frequency receiver includes an amplifier and a detector that produces a bias control signal based on a signal environment. A bias level of the amplifier is set according to the bias control signal. Bias levels other receiver circuits may have similarly adjusted bias levels, including buffers, IF oscillators, mixers, and converters. The invention can be used to increase range of linearity, intermodulation immunity and reduce power consumption by reducing the bias level under typical conditions and relying on the bias control to increase bias levels under adverse signal conditions. The invention has advantages where power is at a premium, particularly when a device is in standby mode, including mobile, portable and hand held pagers and wireless telephones and Internet connections. If standby mode operation in non-maximum signal environments dominates the usage of the receiver, then the invention can substantially increase battery life.

1 Claim, 11 Drawing Sheets

U.S. PATENT DOCUMENTS

| | | |
|---|---|---|
| 5,722,063 A | 2/1998 | Peterzell et al. |
| 5,815,821 A | 9/1998 | Pettersson |
| 6,081,159 A * | 6/2000 | Kim et al. ................ 330/149 |
| 6,134,430 A | 10/2000 | Younis et al. |
| 6,194,972 B1 | 2/2001 | Brown |
| 6,388,526 B1 * | 5/2002 | Daniel et al. ............... 330/285 |
| 6,625,238 B2 | 9/2003 | Wieck |
| 6,668,028 B1 | 12/2003 | Wieck |
| 6,687,491 B2 | 2/2004 | Wieck |
| 6,782,062 B1 | 8/2004 | Wieck |
| 6,785,324 B1 * | 8/2004 | Schultz et al. ............. 375/219 |
| 2001/0034217 A1 | 10/2001 | Loke et al. |
| 2003/0173793 A1 | 9/2003 | Stromberg |
| 2004/0105511 A1 | 6/2004 | Wieck |

FOREIGN PATENT DOCUMENTS

| | | |
|---|---|---|
| JP | 200115665 A | 6/2001 |
| WO | WO 01/74000 | 10/2001 |
| WO | WO 03/063338 | 7/2003 |

OTHER PUBLICATIONS

U.S. Appl. No. 09/539,165, filed Mar. 29, 2000, Wieck.
U.S. Appl. No. 09/753,123, filed Dec. 29, 2000, Wieck.
U.S. Appl. No. 10/051,250, filed Jan. 18, 2002, Wieck.

* cited by examiner

LOW POWER AND HIGH LINEARITY RECEIVERS WITH REACTIVELY BIASED FRONT ENDS

CROSS-REFERENCE TO RELATED APPLICATION

This application is a continuation of U.S. patent application Ser. No.: 09/753,123, filed Dec. 29, 2000 now U.S. Pat. No. 6,625,238, which is a continuation-in-part of U.S. patent application Ser. No. 09/538,606, filed Mar. 29, 2000 now U.S. Pat. No. 6,782,062, wherein U.S. patent application Ser. No. 09/753,123 is hereby fully incorporated herein by reference.

FIELD OF THE INVENTION

The invention relates to the design of electronic receivers. In particular, it relates to achieving a low power and high linearity receiver by means of reactively adjusting the bias level used by its front-end circuits, such as amplifiers, buffers and mixers.

RELATED APPLICATIONS

This application is a continuation in part of U.S. patent application Ser. No. 09/539,165, filed Mar. 29, 2000, entitled "Low Power and High Linearity Receivers with Reactively Biased Front Ends" by the same inventor and assigned to the same assignee.

BACKGROUND OF THE INVENTION

An electronic amplifier accepts as its input an electronic signal and produces as its output a stronger version of that electronic signal. For example, recording an electrocardiogram on a chart requires amplifying the weak electrical signal produced by a beating heart until the signal is strong enough to move a pen up and down as a paper chart moves past the pen.

A linear amplifier is one in which there is a linear relationship between the electronic signal it receives as input and the electronic signal it produces as output. That is, for a change of X units in its input voltage or current, it produces a change in its output voltage or current of k*X (k times X) units for some constant value k, regardless of whether the value of the input signal is small or large.

Every electronic circuit is unable to product outputs larger than some limit. Every electronic circuit is unable to effectively handle inputs larger than some limit or smaller than some other limit. Nevertheless, for many applications of electronic circuits, it is necessary that they be operated only within a middle range where they produce a linear response to changes in their inputs.

Common examples of practical applications where linear amplifiers are used include both audio amplifiers and radio-frequency amplifiers. If you listen to an audio amplifier that is not linear in its response, then you hear the music or voice as distorted or flat.

Non-linear responses in radio-frequency amplifiers can produce cross talk or intermodulation between the desired signal and another extraneous radio signal that happens to be present at the same time, but on a different frequency or channel. Such undesired signals are called jamming sources whether or not the interference is intentional. When an amplifier behaves non-linearly, for example, a change of X in its input signal produces less than k*X change in its output signal, then the effect of this non-linearity is to shift the frequency of the signal that it amplifies. If a desired signal and a jamming source at different frequencies are present at the same time (which is typical of the operating environment for radio receivers), then this frequency shift results in cross talk or intermodulation between the two signals.

Many electronic amplifiers electrically combine their input signal with a constant or bias voltage or current. The amount of bias used is chosen in order to set an appropriate operating point for the amplifier. When an electronic amplifier is designed, an important choice is whether to make that constant bias have a relatively large or a relatively small value. The bias value chosen when designing the amplifier can have major consequences on how and how well it operates.

One standard technique in designing a linear amplifier is to first specify the range of the input signal over which the amplifier must respond linearly and the degree to which the amplifier must reject intermodulation from undesired sources. Then, the amount of bias current or voltage is set so as to meet to these specifications. The larger the range of linearity desired and the lower the amount of intermodulation that is acceptable, then the larger the bias must be.

Unfortunately, the larger the bias of an amplifier, the more power it consumes. Thus, there is a tradeoff between an amplifier's power consumption on the one hand and its range of linearity and susceptibility to intermodulation on the other hand. The design goal of minimizing power consumption opposes the design goal of maintaining acceptable linearity.

Power conservation is always desirable. But with the advent of widely used mobile, hand-held and pocket wireless devices, such as pagers and cellular telephones, its importance has increased.

The radio-frequency amplifiers, buffers and other front-end circuitry in a pager or in the receiver section of a cellular or other mobile telephone must be operating in order for the device to respond to a page or phone call broadcast to it. Thus, the length of time that a battery will last while the device is standing by for a page or a phone call depends on how much power is consumed by its receiver. To many consumers, most of the power consumed by the device is consumed in standby mode—for example, a mobile phone may be standing by for a call many hours each day but in use for calls only minutes each day.

Longer battery life reduces the costs and increases the convenience for consumers who use, for example, portable devices, including but not limited to mobile devices, hand held devices, pagers, mobile phones, digital phones, PCS phones and AMPS phones. In these highly competitive markets, battery life in standby mode can make the difference as to which competing product the consumer chooses. Thus, it is critical for the market success of mobile, portable and hand-held receivers that they consume a minimum of power, particularly in standby mode.

The standby battery life of a mobile receiver can be significantly increased by lowering its power consumption by lowering the bias level used in its front-end circuits such as amplifiers and buffers. However, prior art techniques for doing this also reduce the receiver's linear range and thus increase its susceptibility to intermodulation from jamming sources.

SUMMARY OF THE INVENTION

Thus, there is a need for amplifiers, buffers and other front-end circuits for receivers in which power consumption can be decreased in favorable signal environments without reducing linearity or increasing intermodulation susceptibility in adverse signal environments. This need can be met by means of reactively adjusting the bias level at which such circuits operate, i.e. by increasing its bias level in reaction to adverse or strong signal environments so as to allow it to operate using less power in weaker or typical signal environments.

One embodiment of the invention includes methods and apparatuses for a radio frequency receiver amplifier that amplifies an input signal into an output signal, a detector that produces a bias control signal indicating the signal strength; and a bias generator that sets the bias level of the amplifier according to the bias control signal such that the bias level generally increases as the signal strength increases.

Another embodiment of the invention includes methods and apparatuses for a buffer for use in a radio frequency receiver; a detector that produces a bias control signal indicating the signal strength; and a bias generator that sets the bias level of the mixer according to the bias control signal.

Other embodiments of the invention include methods and apparatuses for other reactively biased circuits within a radio frequency receiver, including but not limited to low noise amplifiers, linear amplifiers, mixers and radio frequency to intermediate frequency converters.

Various embodiments of the invention are suitable for use in applications including but not limited to pager receivers, wireless Internet receivers, wireless telephone receivers, cellular telephone receivers, and code division multiple access (CDMA) receivers.

Another embodiment of the invention includes methods and apparatuses for a multi-stage receiver with a detector that produces a bias control signal indicating a signal strength; and a plurality of bias generators that set the bias level of the corresponding stages according to the bias control signal.

Another embodiment of the invention includes methods and apparatuses for a reactively biased, multi-stage receiver wherein each amplification stage reactively adjusts its own bias level.

BRIEF DESCRIPTION OF THE DRAWINGS

Various embodiments of the invention are illustrated in the following drawings, in which known circuits are shown in block-diagram form for clarity. These drawings are for explanation and for aiding the reader's understanding. The invention should not be taken as being limited to the embodiments and design alternatives illustrated.

FIG. 5 also shows the functional components and their interconnections for an embodiment of the invention in a transceiver, i.e. a device that both transmits and receives.

DETAILED DESCRIPTION OF THE INVENTION

Disclosed herein are various alternative embodiments of and alternative designs for the invention. The invention, however, should not be taken as being limited to the embodiments and alternatives described. One skilled in the art will recognize still other alternative embodiments and designs, as well as various changes in form and detail. These may be employed while practicing the invention without departing from its principles, spirit or scope.

Figure 1:
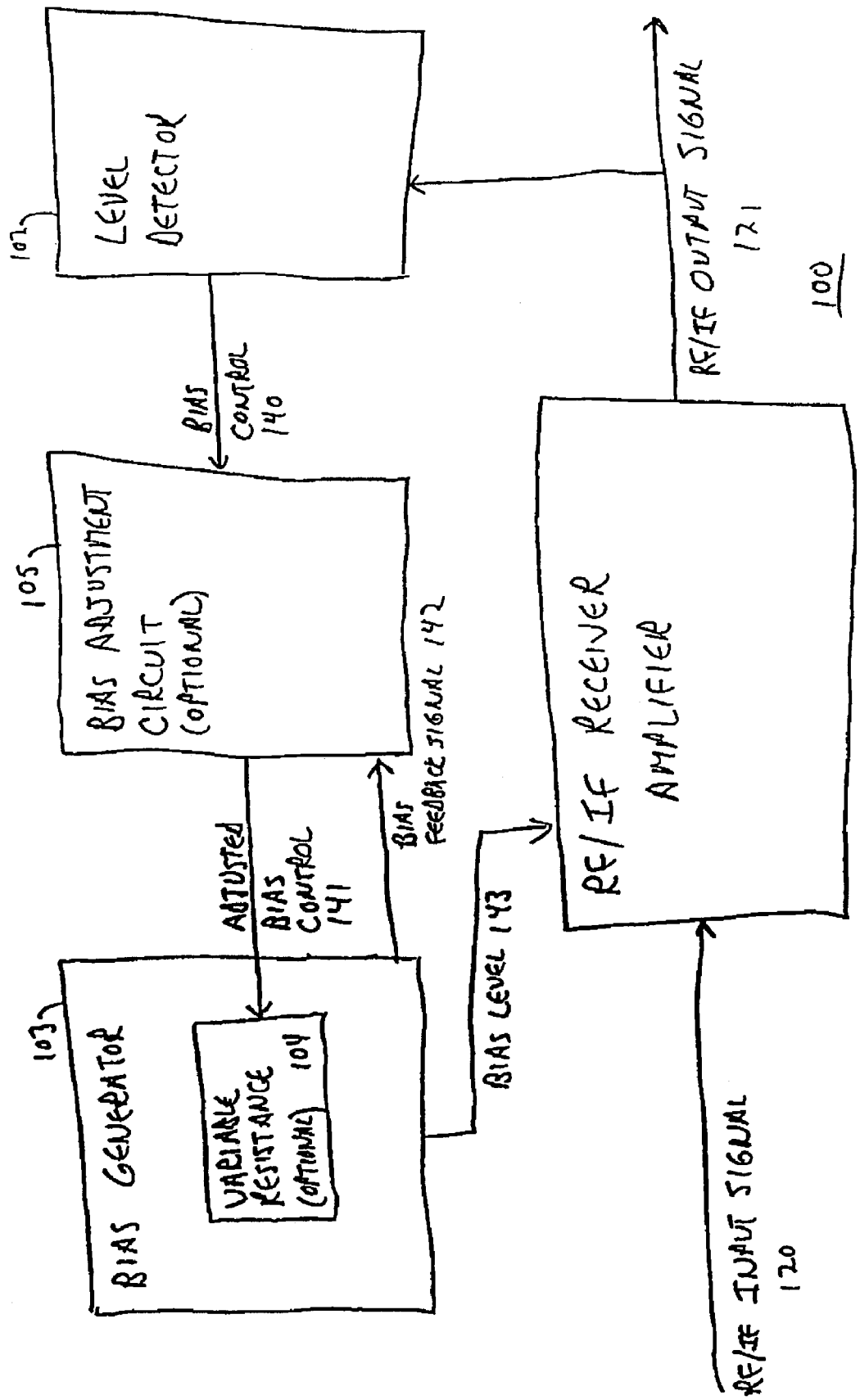
FIG. 1 shows the building blocks, or functional components, that make up one embodiment of the invention. This embodiment is a receiver amplifier that adjusts its own bias level in reaction to the current signal strength within its environment. It also shows the interconnections of these functional components.

FIG. 1 is a functional block diagram of receiver amplifier 100 according to one embodiment of the invention. This amplifier has reactive biasing, i.e. it adjusts its bias level in reaction to the signal strength with which it is currently operating.

RF/IF receiver amplifier 101 amplifies input signal 120 into output signal 121. The bias of amplifier 101 is set by bias level 143, which is produced by bias generator 103.

RF/IF receiver amplifier 101 can be any type of linear amplifier with characteristics suitable for radio-frequency (RF), intermediate frequency (IF), or other applications. RF/IF receiver amplifier 101 can be, but is not limited to, a common emitter amplifier, a common base amplifier, a common collector amplifier, a voltage amplifier, a current amplifier, a transconductance amplifier, a transresistance amplifier, an amplifier with feedback, or an amplifier without feedback. In some embodiments of the invention, reactive biasing is applied only to RF stages, or only to some of the initial RF stages, and the bias levels on IF stages are fixed according to conventional techniques.

As shown in FIG. 1, level detector 102 detects the signal level of RF/IF output signal 121, and thus it indirectly detects the signal level of RF/IF input signal 120. Alternatively, level detector 102 can directly detect the signal level of RF/IF input signal 120 or of an intermediate signal between the input and the output signal. Level detector 102 produces bias control signal 140 according to the signal level that it detects.

Level detector 102 can be any type of circuit that is able to detect changes, over an appropriate time frame, in the signal level with which the receiver is currently operating. For example, level detector 102 can be a rectifier, or a heat generator of some type coupled to a heat monitor such as a thermsistor.

The detected signal level can indicate an averaged signal level that depends on the signal environment in which the receiver is current operating, with the average being taken over a suitable period of time. Generally, the frequency of bias level 143 should be limited to be orders of magnitude lower than the frequency of the signal of interest. As a first example, a 2 MHz response in bias level may provide an appropriate time frame over which to average the signal level and adjust the bias level for a 2 GHz carrier signal such as is used in a code-division multiple access (CDMA) signal.

Also, consideration should be given to the possibility of spurious sidebands arising between the bandwidth of the bias level transfer function and the bandwidth of the signal of interest. To continue with the CDMA example where the desired CDMA signal has a bandwidth limited to 1.25 MHz, a response in bias level limited to being near 2 MHz may keep any such sidebands out of the receiver's bandwidth, and thus minimize interference with the CDMA signal.

Alternatively, the response in bias level could be limited to being below the receiver's bandwidth. As a second example, a 100 Hz bias adjustment response may minimize interference with a voice signal limited to between 500 and 3,000 Hz. However, limiting the frequency of bias level 143 to be below the range of the signal of interest may undesirably slow down the response time of the receiver to changes in signal strength. This could be significant to system performance if the current signal environment includes a jamming signal that is only intermittently present.

Thus, bias level 143 should be able to vary quickly enough that the performance of the overall system in which the reactively biased amplifier is used is not harmed by a lag or hysteresis effect, such as might occur when a high-signal environment changes to a low-signal environment, or visa versa.

Bias generator 103 produces bias level 143 according to the appropriate bias control signal. If bias adjustment circuit 105 is used, then bias generator 103 varies bias level 143 according to adjusted bias control signal 141, otherwise bias control signal 140 is used. Bias generator 103 can be any circuit that varies bias level 143 within a target range according to the appropriate bias control signal.

In amplifiers with reactive biasing, level detector 102 and bias generator 103 to operate such that the bias applied to RF/IF receiver amplifier 101 tends to increase as the input/output signal levels increase, i.e. as the receiver is used in an environment having stronger signal conditions. However, this increase need not be a linear or even monotonic increase. In some designs, the bias level may only generally tend to increase as the signal level increases. Preferably, this general tendency to increase is sufficient to keep RF/IF receiver amplifier operating with sufficient linearity and intermodulation rejection for the particular application.

In embodiments of the invention that use bias adjustment circuit 105, it adjusts, filters, amplifies and/or conditions bias control signal 140 into adjusted bias control signal 141, which is then used by bias generator 103 to generate bias level 143. The adjustment or adjustments applied may include any transfer function, preferably but not necessarily monotonic, including but not limited to conditioning, filtering, clipping, expanding, amplifying, dampening, scaling, offsetting, band limiting, sampling and holding and/or summing with an DC offset.

Bias adjustment circuit 708 can also include circuitry that compensates for threshold variations of active devices within the reactive biasing system, including but not limited to variations in the threshold of its field effect transistors (FETs). Because the linear range of a FET may be narrow, it may be important to calibrate or set the levels used so as to maintain the circuit's operation within that linear range.

Bias adjustment circuit 105 could be any circuit that produces adjusted bias control signal 141 as a function of bias control signal 140. If regulating feedback signal 142 is used, then bias adjustment circuit 105 can also vary bias level 143 according to regulating feedback signal 142.

Various embodiments of bias adjustment circuit 105 include but are not limited to circuitry that conditions bias control signal 140, that scale it, that compare it against a reference level, that samples and holds appropriate levels so as to calibrate a reference level corresponding to a given signal environment (such as an environment that is relatively free of jamming signals). Other embodiments include combinations of such circuitry.

In embodiments of the invention that use variable resistance 104, it can function as a circuit element within bias generator 103. By varying its resistance, variable resistance 104 alters bias level 143. Variable resistance 104 could be any circuit that varies its resistance as a function of control signal 140, or of adjusted bias control signal 141 when available. Variable resistance 104 can be employed within bias generator 103 so as to vary the current of bias level 143, so as to vary the voltage of bias level 143, or both.

In embodiments of the invention that use bias feedback signal 142, it can simply be bias level 143, or it can be a signal derived from bias level 143 or a signal that is a predecessor of bias level 143. Its use is optional, but it increases the stability of bias level 143, particularly when the circuit is operated under a wide range of voltage or temperature conditions, or when manufacturing tolerances of bias generator 103 or of other portions of the receiver have a significant impact on bias level 143 or on what bias level 143 should be set to. Embodiments of the invention that use bias feedback signal 142 can also be somewhat self calibrating as to the amount of variation produced in bias level 143.

In some embodiments of the invention, the distinctions between level detector 102, bias adjustment circuit 105 and bias generator 103 break down and particular circuit components operate to produce multiple functions.

It is possible, and may be desirable in some applications, for one detector to provide a bias control signal to multiple conditioners, or for one bias adjustment circuit to provide a bias control signal to multiple bias generators.

Reactive biasing allows amplifier 100 to be designed such that its power consumption in typical signal environments is decreased without reducing its linearity or intermodulation immunity in strong signal environments. Amplifier 100 can be designed with a bias level that is low, relative to the maximum signal environment it might be used in. Then, when it is used in a strong signal environment, it adjusts its bias upwards, which increases its linearity and intermodulation immunity during the period of time that the strong signal environment is present.

Such a linear amplifier with low power consumption in typical signal environments is particularly advantageous for mobile, hand held or pocket devices such as pagers, telephones or wireless data connections. With the advent of such devices, it has become critical to design linear amplifiers that consume as little power as possible while waiting for a signal that is addressed to them. This waiting mode may dominate the usage cycle of such devices, thus power savings during this mode may have a significant impact on battery life.

The RF and IF amplifiers in a cellular telephone, pager or data receiver must be operating in order for the device to respond to a phone call, page, e-mail or other transmission that is broadcast to them. Thus, the length of time that a battery will last while the device is standing by for a transmission addressed to the device depends on how much power is consumed by the amplifiers and other circuits in its receiver section.

The power consumption of some mobile devices can be significantly reduced by using amplifiers, buffers, mixers and other circuits that embody the invention in the mobile device's receiver. In some applications, the invention significantly increases the length of time that a battery lasts when the mobile device is in standby mode.

Many mobile devices are in standby mode much of the time. For example, a mobile telephone user may have their phone on ten hours a day, of which only ½ hour is spent actually using a phone connection. In this case, their cellular, PCS, amps or other mobile phone spends 9½ hours a day only receiving, i.e. listening for a call directed to them, and ½ hour per day both receiving and transmitting. In such a usage pattern, the phone's receiver section is active 19 times longer than its transmitter section. Thus, receiver power reduction can substantially reduce having to change or recharge batteries or other energy storage devices in the mobile device, which can produce a corresponding gain in user convenience and reduction in user expense.

In some embodiments of the invention, reactive biasing can allow linear amplifier 101 to be designed such that its linearity and intermodulation immunity are increased. When such an amplifier is used in a strong signal environment, it adjusts its own bias upwards, thus increasing its linearity and intermodulation immunity. Rather than utilizing reactive biasing for reducing the receiver's power consumption, these embodiments of the invention utilize it for increasing the receiver's range of linearity.

Figure 2A:
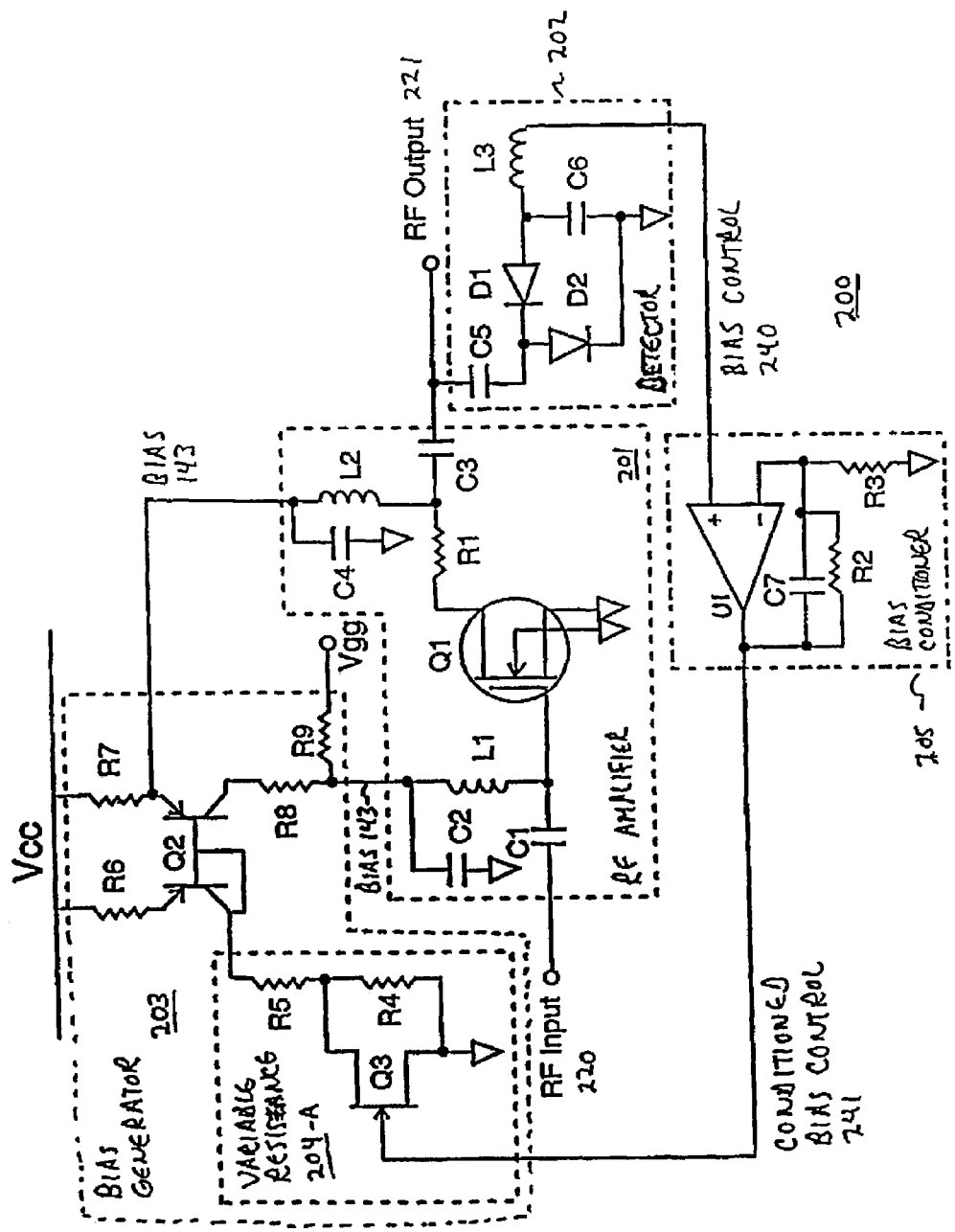
FIG. 2 shows electronic circuit components and their interconnections that can be used to make each of the functional components shown in the previous figure. The embodiment of the invention shown is suitable for small signal or low noise applications. Also, this embodiment is suitable for a modular, multi-stage embodiment of the invention. The functional component shown as variable resistance 204-A in FIG. 2(*a*) can be replaced with variable resistance 204-B in FIG. 2(*b*) or with variable resistance 204-C in FIG. 2(*c*).
Figure 2:
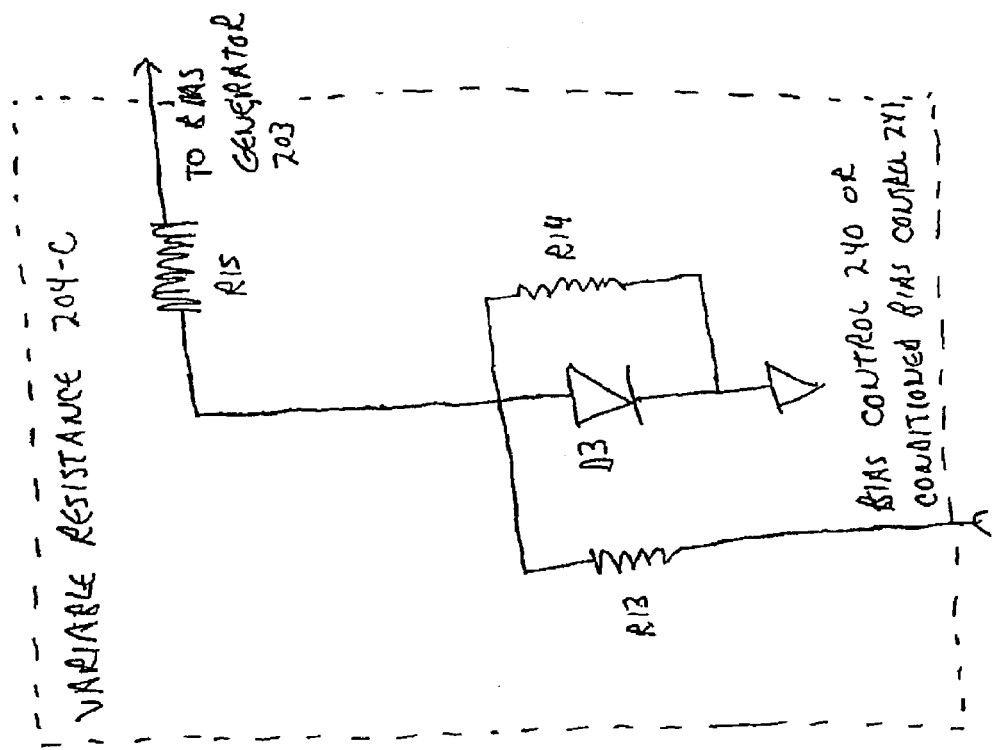
Figure 2:
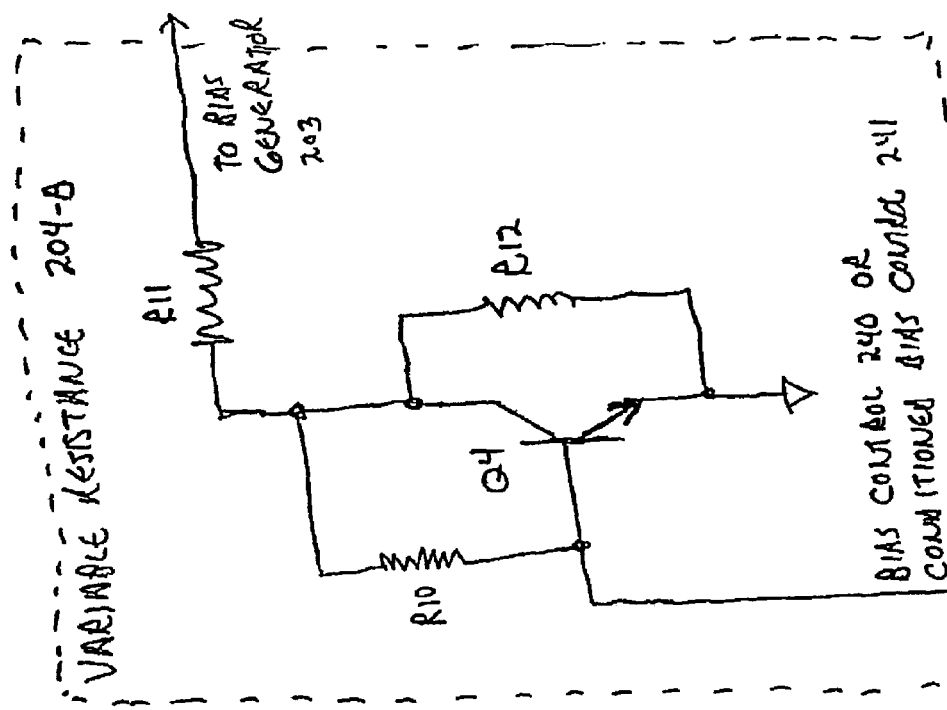

FIG. 2 is a circuit diagram of a small-signal or low-noise radio frequency (RF) reactively biased receiver amplifier according to one embodiment of the invention.

FIG. 2(a) shows the amplifiers components partitioned into functional blocks corresponding to those shown in the previous figure. Those skilled in the art will recognize that there are numerous ways of implementing each of these functional blocks and that other ways will be developed. These are all within the principles, spirit and scope of the invention.

The variable resistance block within amplifier 200 can be implemented in various ways, including but not limited to variable resistance 204-A, shown in FIG. 2(a), variable resistance 204-B, shown in FIG. 2(b), and variable resistance 204-C, shown in FIG. 2(c).

The components of the amplifier of FIG. 2, their preferred values and their functional descriptions are given by the following table:

TABLE 1

Components of Low Noise, Reactively Biased RF Amplifier

| Reference Designator | Suitable Value | Function |
|---|---|---|
| *RF Amplifier 201* | | |
| C1 | ~1.0–22 pF | RF tuning and DC block capacitor |
| C2 | ~10–1000 pF | RF decoupling capacitor |
| C3 | ~1.0–22 pF | RF tuning and DC block capacitor |
| C4 | ~10–1000 pF | RF decoupling capacitor. |
| L1 | ~1.5 to 22 nH | RF tuning and DC bias feed inductor |
| L2 | ~1.5 to 22 nH | RF tuning and DC bias feed inductor |
| R1 | 0 to 27 ohm | Lossy resistance to aid stability |
| Q1 | | RF frequency, high linearity Field Effect Transistor (FET), low noise preferred |
| *Detector 202* | | |
| C5 | ~1–22 pF | Provides DC blocking and RF coupling between the output of RF amplifier 201 and level detector 202. The smaller its value, the less the coupling. |
| C6 | ~22–100 pF | RF decoupling capacitor |
| D1 | | Rectification diode chosen for desired detector characteristics |
| D2 | | Rectification diode chosen for desired detector characteristics |
| L3 | ~22–39 nH | RF choke |
| *Bias Conditioner 205* | | |
| C7 | 27–1000 pF | Capacitor to set the time constant (or the cut off frequency) of the bias control signal |
| U1 | | Op amp chosen for signal swing range and response time characteristics |
| R2 | ~1–100 K ohm | Resistor to set the gain/scaling for the bias level conditioning |
| R3 | ~1–100 K ohm | Resistor to set the gain/scaling for the bias level conditioning |
| not shown | | Diodes may be optionally used for shaping the input/output characteristic of this stage |
| *Variable Resistance 204* | | |
| Q3 | | Field effect transistor (FET) chosen for its characteristic of drain-source resistance versus bias |
| R4 | ~51–100 K ohm | Resistor to scale the variable resistence network |
| R5 | 10–~51 K ohm | Resistor to scale the variable resistence network |
| *Bias Generator 203* | | |
| Q4 | | Dual PNP bias transistor |
| R6 | ~2.7 to 10 K ohm | Sets current on left PNP transistor within Q4, helps set how much Q1's bias varies with signal strength |
| R7 | ~10 to 100 ohms | Sets DC bias through Q1 |
| R8 | ~10 to 100 K ohms | Aids stability of DC bias network |
| R9 | ~10 to 100 K ohms | Aids stability of DC bias network |

The use of op amp U1 or of any type of active amplification in the bias control path, adds cost, complexity and power consumption to the receiver. Nevertheless, U1 can support several potentially advantageous features of this embodiment of the invention.

One advantage of using an op amp is that relatively precise control can be obtained over the bias level and the gain, limiting, filtering and hysteresis of its adjustment.

Also, by using an op amp such as U1, feedback can be used to compensate for variations due to temperature changes or component tolerances. This feedback could be directly from the bias current in the amplification device, such as by sensing the voltage drop across R7.

Another way to obtain such precision is via digitizing the detected signal level. The digital signal level can be used as an index into a look-up table, which can contain a precisely calibrated digital bias level for each digital signal level. The digital bias level can then be converted back into an analog bias level.

Another advantage of using an op amp such as U1 is that it provides an amplification element in the bias control path.

One factor that should be considered in the design of a reactively biased RF amplifier is that non-linearity in the RF front end of a receiver can have a significant system impact at fundamental peak signal levels that are very small. These peak signal levels may be much smaller than the bias level of the RF amplifier. U1's amplification of the relatively small detected signal level allows the bias level of the RF amplifier to vary over an appropriate range.

Another factor that plays an important role in the design of reactively biased RF amplifiers according to the invention is the measure of intermodulation known as the $IIP^3$, or the third-order input intermodulation product. If an amplifier is non-linear, then the energy of the input signal is shifted into harmonics of the frequency of the input signal. If two signals at different frequencies are present in a signal amplified non-linearly, then these harmonics intermodulate or mix to produce intermodulation products, i.e. multiple frequencies at the sum and difference of all of the frequencies present. If these products fall within the bandwidth of the signal of interest and have sufficient amplitude, then the usability of the receiver deteriorates. The $IIP^3$ is a measure of the amplitude of these intermodulation products A receiver's $IIP^3$ can be estimated by one skilled in the art based on its circuit configuration and component values. Also, it can be determined via a circuit simulation based on a hypothetical signal environment, i.e. the signal strength, frequency and bandwidth of the desired signal and of any jamming or extraneous signals. Also, it can be measured based on the performance of an actual prototype or production receiver.

Yet another design factor to be considered is cross talk, i.e. where the transmitted signal from a transceiver enters its received signal path and becomes part of the receiver's signal environment. The design details of how to reduce the adverse affects of cross talk with appropriate filtering will be easily determined by one skilled in the art, where the filtering is between the transmitter section and the receiver, within the receiver section, or both.

Nevertheless, cross talk can interact with intermodulation. This interaction can be difficult to predict via static calculations. These interactions can be examined by one skilled in the art, by means of dynamic simulation of the circuit design using realistic models of signal environments, perhaps based on target specifications for intermodulation rejection. They can also be examined by experimental testing of bread boards of the circuit design and of prototype transceivers or production transceivers. Because reactively biased amplifiers dynamically vary their intermodulation rejection, such simulations and testing can play an important role in determining how much to vary the bias level in different signal environments.

Another design factor to be considered is that the target specifications published for receivers do not take into account the effects of reactive biasing. Published specifications may assume that a high-noise environment is the worst case for a receiver; thus, they may only specify target intermodulation parameters under such conditions. A reactively biased receiver could operate well under the published test conditions because it detects the strong signal environment and ups its bias levels accordingly. However, it is possible for that same receiver to have problems in the presence of intermediate levels of jamming signals (or even under low levels of jamming signals) if it is too aggressive about lowering its bias levels under such conditions.

Thus, a reactively biased receiver should be designed for and tested over the entire range from high levels of jamming signals to minimal or non-existant jamming signals.

Another design factor to be considered is a possible effect on the gain of the amplifier when its bias level is reactively adjusted. It may be desirable to select the range of bias level and other characteristics of the amplifier such that there is little if any change in its gain as it is reactively biased. One benefit of such an approach is that it may be desirable to keep the amplifier operating at or near maximum gain, particularly if the amplifier is early in the front end of the receiver where the signal strengths are low.

Another benefit of this approach is that it minimizes the possibility of a positive feedback loop with respect to the receiver's gain. The gain feedback loop arises as follows: a stronger signal level being detected increases both the bias level and the gain of the amplifier, then a still stronger signal level will be detected, which will again increase the bias level and again increase the gain, etc. If such a change in gain of 1 dB (for example) results in a subsequent change in gain of substantially less than 1 dB, then this feedback effect will stabilize. In this case, this feedback effect can have a desirable effect on the shape of the transfer function over the bias range—for example, it may reduce or eliminate the need to amplify or condition the bias control signal.

On the other hand, if a change in gain of 1 dB (for example) results in a subsequent change in gain near, or more than 1 dB, then this feedback effect will not stabilize. Thus, the reactive biasing and perhaps the receiver itself will not operate properly.

Figure 3:
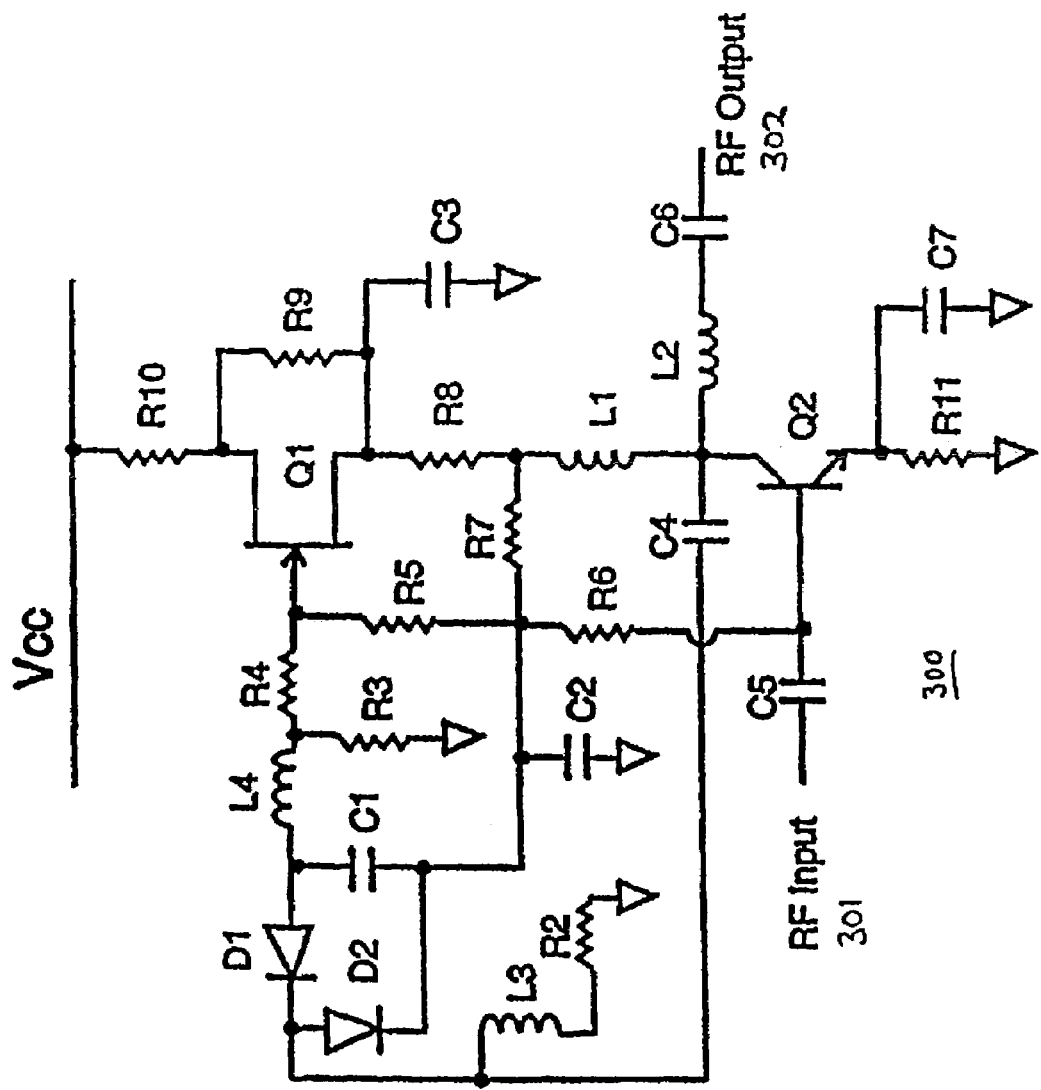
FIG. 3 shows the electronic circuit components and their interconnections for another embodiment of the invention, specifically a simplified self-adjusting RF amplifier.

FIG. 3 is a circuit diagram of a simplified RF amplifier, according to one embodiment of the invention. This circuit avoids the costs, complexity and power consumption of the op amp of the circuit of FIG. 2. This is a significant reduction. In terms of circuit area for an implementation on a monolithic integrated circuit and in terms of power consumption, U1's area and power requirements might be on the order of those of all of the rest of FIG. 2's circuitry put together.

This embodiment also blurs the distinctions among the functional blocks shown in FIGS. 1 and 2 in that several of this circuit's components affect how the circuit functions in multiple ways that cross the boundaries of these functional blocks.

The components of the self-adjusting, reactively biased RF amplifier of FIG. 3, their suitable values and their functional description are given by the following table:

TABLE 2

Components of Simplified, Reactively Biased RF Amplifier

| Reference Designator | Suitable Value | Function |
|---|---|---|
| C1 | ~0.1 uF | Helps set the time constant of the detector circuit. Also provides RF decoupling. |
| C2 | ~22 pF | Provides RF bypass to prevent RF feedback |
| C3 | ~22 pF | Optional. Provides RF bypass at the source of Q1. |
| C4 | ~22 pF | Provides DC blocking and impedance matching for the detector circuit |
| C5 | ~2–22 pF | Provides DC blocking and impedance matching for the input of the amplifier |
| C6 | ~2–22 pF | Provides DC blocking and impedance matching for the output of the amplifier |
| C7 | ~22 pF | Provides RF bypass at the emitter of Q2 |
| D1 | Schottkey | Rectification diode for the detector circuit |
| D2 | Schottkey pair | Voltage doubler diode and return path for the detector current |
| L1 | ~6.8 nH | RF choke and load matching inductor |
| L2 | ~4.7 nH | Output matching inductor |
| R2 | ~1 K ohms | Sets bias of the detector circuit |
| R3 | ~5 K ohms | Sets time constant and bias voltage of the detector circuit |
| R4 | ~30 K ohms | Optional. Scales the bias level |
| R5 | ~50 K ohms | Sets bias feedback for Q1. Also aids in conditioning the bias control. Also helps set the bias level. |
| R6 | 10~20 K ohms | Operates with R7 to set bias feedback for Q2 |
| R7 | ~10 K ohms | Sets feedback for both Q1 and Q2. Also helps set the bias level. |
| R8 | ~10 ohms | Part of bias feedback for Q1. Also helps set the collector bias for Q2 |
| R9 | ~140 ohm | Scales the variable resistance of Q1 |
| R10 | 0—~10 ohms | Optional. Sets collector bias of Q2 without providing feedback on Q1 |
| R11 | 0—~20 ohms | Optional. Provides Q2 emitter stabilization resistance |
| Q1 | N-channel power FET | Biasing transistor configured to form a variable resistance circuit |
| Q2 | Bipolar RF transistor | Amplifying transistor |

One factor that should be taken into consideration in the design of a reactively biased RF amplifier according to the invention is that the non-linearity in the RF or front end of a receiver can have a significant system impact at fundamental peak signal levels much smaller than the bias level of the RF amplifier. Therefore, it is desirable that the detector be able to sense a small signal and apply enough bias control to accommodate this signal condition. One way this can be done is for matching elements to be added at the detector's input, which are coordinated with the matching elements at the amplifier's output. While this can be an effective technique in some situations, active amplification along the lines of the previous figure may be required in some low-noise or small-signal applications.

Figure 4:
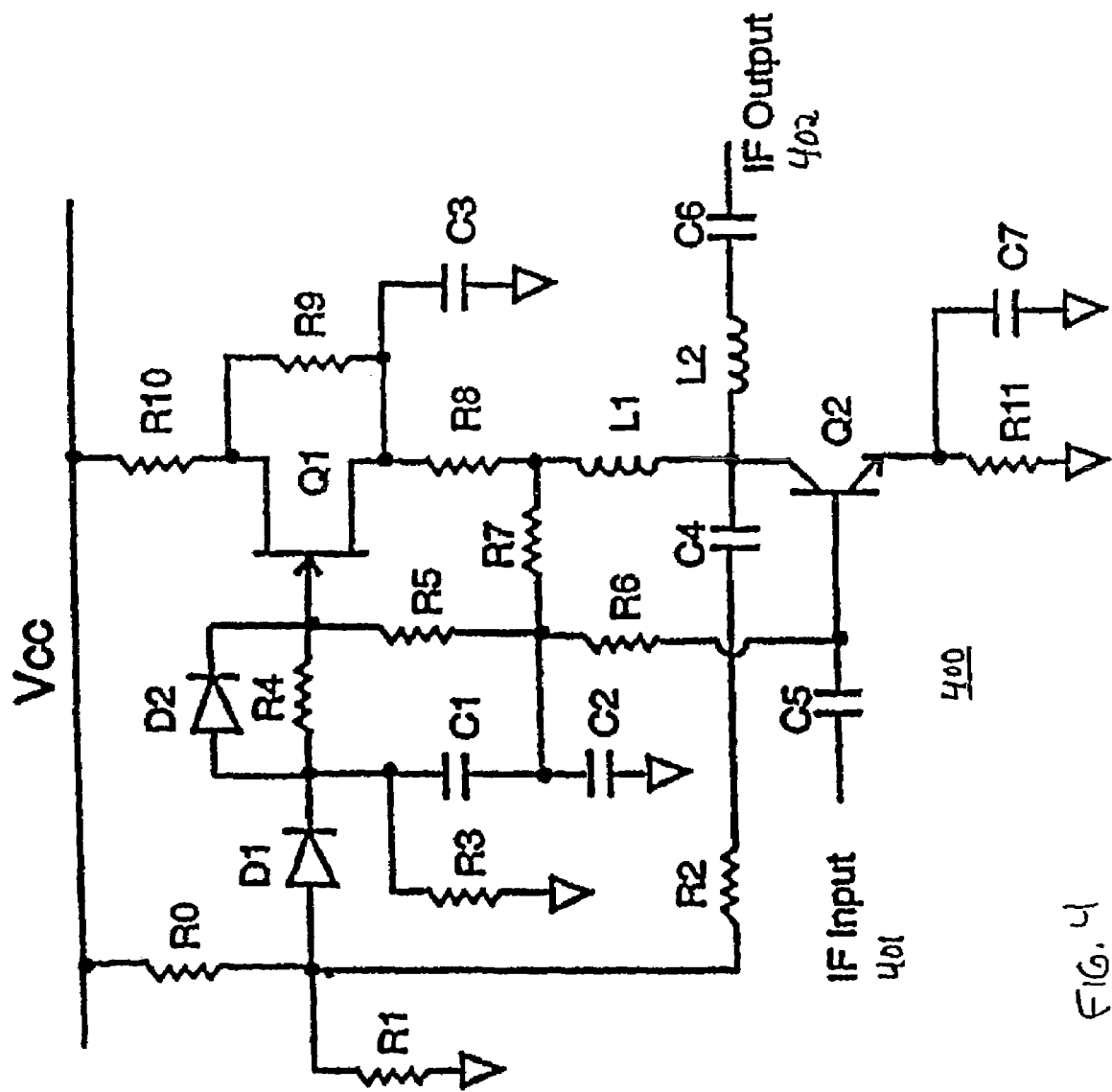
FIG. 4 shows the electronic circuit components and their interconnections for an embodiment of the invention, specifically a self-adjusting IF amplifier.

FIG. 4 is a circuit diagram of a self-adjusting, reactively biased intermediate frequency (IF) amplifier according to one embodiment of the invention. Its components, their preferred values and their functional scriptions are given by the following table:

TABLE 3

Components of Reactively Biased IF Amplifier

| Reference Designator | Suitable Value | Function |
|---|---|---|
| C1 | ~0.1 uF | Sets the time constant of the detector circuit |
| C2 | ~100 pF | Provides IF bypass to prevent IF feedback |
| C3 | ~100 pF | Optional. Provides IF bypass at the source of Q1. |
| C4 | ~100 pF | Provides DC blocking and impedance matching for the detector. However, without C4, the DC present could be used to bias the detector. |
| C5 | ~2–22 pF | Provides DC blocking and impedance matching for the input of the amplifier |
| C6 | ~2–22 pF | Provides DC blocking and impedance matching for the output of the amplifier |
| C7 | ~100 pF | Provides IF bypass at the emitter of Q2 |
| D1 | Schottkey | Rectification diode for the detector circuit |
| D2 | Schottkey pair | Optional. Accelerates the response of the system to changes in signal conditions at the high end |
| L1 | ~560 nH | IF choke and load matching inductor |
| L2 | ~330 nH | Output matching inductor |
| L3 | 22–39 nh | RF choke |
| R0 | ~30 K ohms | Optional. Establishes an active bias for the detector circuit, which may or may not be desired |
| R1 | ~100 K ohms | Optional. Scales the IF input to the detector |
| R2 | ~30 K ohms | Optional. Scales the IF input to the detector |
| R3 | ~5 K ohms | Optional. Establishes a DC return path and sets a leakage bias for the detector |
| R4 | ~30 K ohms | Optional. Scales the bias level |
| R5 | ~50 K ohms | Sets bias feedback for Q1 and sets the time constant of the detector |
| R6 | ~10–20 K ohms | Operates with R7 to set bias feedback for Q2 |
| R7 | ~10 K ohms | Sets feedback for both Q1 and Q2 |
| R8 | ~10 ohms | Part of bias feedback for Q1. Also helps set collector bias for Q2 |
| R9 | ~140 ohm | Scales variable resistance of Q1 |
| R10 | 0—~10 ohms | Optional. Sets collector bias of Q2 without providing feedback on Q1 |
| R11 | 0—~20 ohms | Optional. Provides Q2 emitter stabilization resistance |
| Q1 | N-channel power FET | Biasing transistor configured to form a variable resistance circuit |
| Q2 | Bipolar IF transistor | IF amplifying transistor |

In an alternative embodiment of a reactively biased IF amplifier according to the invention, R0 could provide the detector bias.

One factor that should be taken into consideration in the design of a reactively biased IF amplifier according to the invention is that its linearity requirement may not be as great as for a front-end RF amplifier; that is, a substantially stronger jamming signal may be required at IF stages to produce undesirable amounts of intermodulation. Therefore, the relative range of adjustment in the bias level appropriate for an IF amplifier may be smaller than for an RF amplifier.

Another factor that should be taken into consideration in the design of a reactively biased IF amplifier according to the invention is that the signal strength of its output may be substantially higher than for an RF stage. Therefore, it may be possible for its output signal to be scaled, rectified and the resulting signal scaled again. This can allow the IF amplifier to be self-adjusting according to the transfer function desired. In contrast, the relatively weak signals at the RF level may not allow such two-stage scaling.

Figure 5:
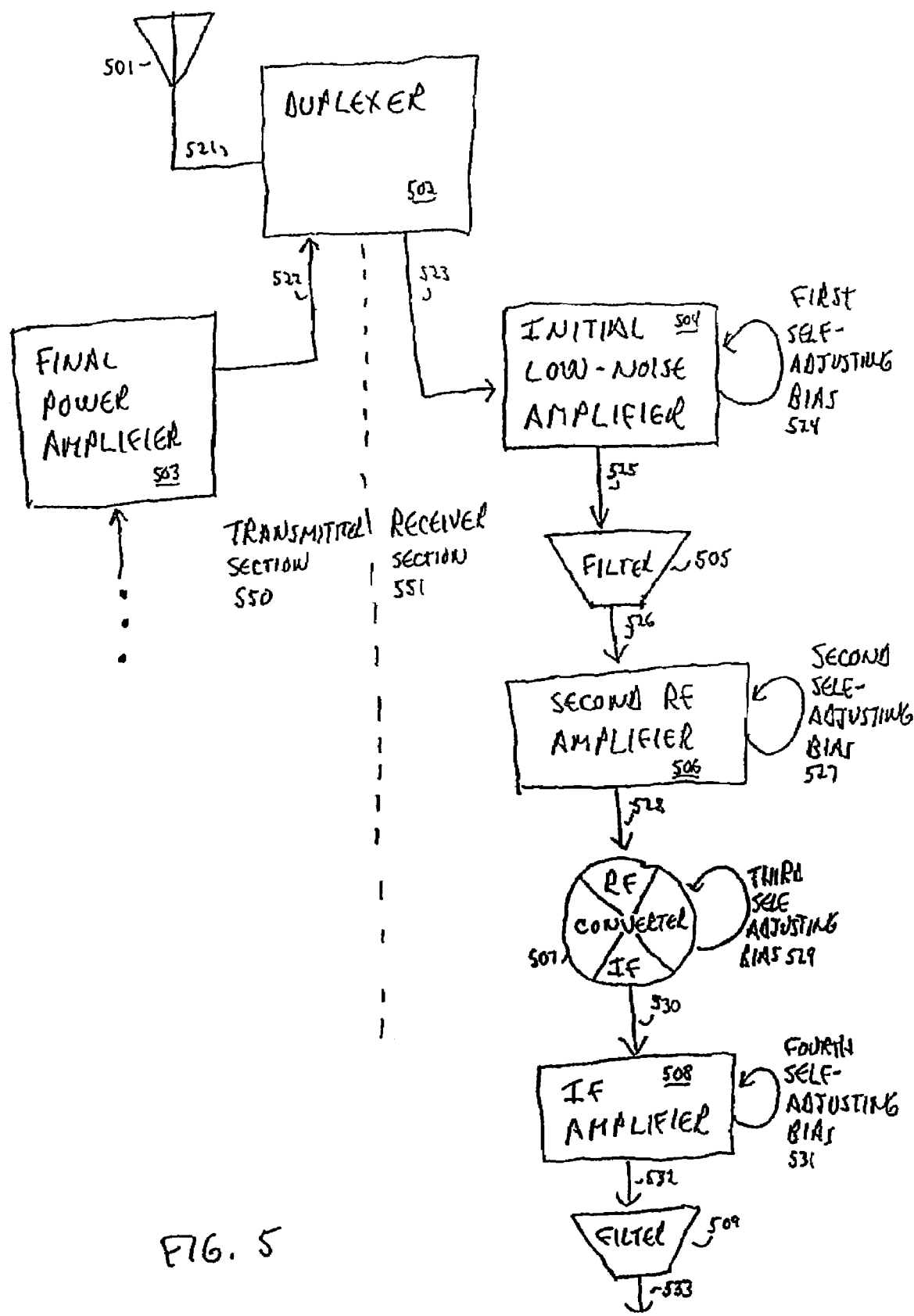
FIG. 5 shows the functional components and their interconnections for yet another embodiment of the invention. This embodiment is the first stages of a receiver within a mobile device such as a cellular telephone. This embodiment has multiple stages of amplification and one stage of frequency conversion, where each stage self-adjusts its own bias level.

FIG. 5 shows the application of one embodiment of the invention in a transceiver application, such as but not limited to a mobile phone device or a two-way pager. In transmitter section 550, final power amplifier 503 provides an RF transmission signal to antenna 501, via antenna signal line 521 and duplexer 502. Duplexer 502 can be a filter, or set of filters, that allows the RF energy output of final power amplifier 503 to be coupled to antenna 501 while filtering this energy to reduce the amount of it that enters the receiver section of the device.

FIG. 5 is also a functional block diagram of the front end of a receiver, according to one embodiment of the invention, with multiple stages of amplification, each stage having self-adjusting reactive biasing. Receiver section 551 receives RF input signal 523 from antenna 501 via duplexer 502. It produces IF output signal 533. As shown, it has four stages of active circuitry, each with self adjusting bias; however, other embodiments can have more or fewer active circuit stages. Also in yet other embodiments, some of the active circuits can have a fixed rather than self adjusting bias, or commonly controlled bias levels Receiver section 551 is not a complete receiver; however, the design details of other circuitry required for a specific application of the invention will be easily determined by one skilled in the art. It may include but not be limited to a local oscillator, local oscillator buffer, IF to audio/digital converter, audio/digital amplification/processing, automatic gain control, user interface, and audio/video input/output.

Initial low-noise amplifier 504 receives RF input signal 523 and produces internal RF signal 525. The bias of initial low-noise amplifier 504 can be set by first self-adjusting bias level 524, which can be produced internally to initial low-noise amplifier 504 (as shown) or can be produced based on internal RF signal 525.

Initial low-noise amplifier 504 can be any type of RF amplifier with characteristics suitable for the particular application. In particular, initial low-noise amplifier 504 can be the RF amplifier shown in FIG. 2, or a variation thereof. Bias adjustment circuit 205, which includes op-amp Q2, allows this amplifier stage to re-actively bias according to changes in the relatively low signal levels at the initial RF stage of a receiver. That is, relatively small changes in RF signal levels of RF input signal 523 can be amplified by op-amp Q2 to produce adjustments in first self-adjusting bias level 524 that are large enough that the linearity/intermodulation rejection of initial low-noise amplifier 504 can be preserved in high-signal environments.

Filter 505 receives internal RF signal 525 and produces internal RF signal 526. Filter 505 can attenuate out of band components within the RF signal, including but not limited to any leakage (through duplexer 502) of transmission energy into the receiver section.

Second RF amplifier 506 receives internal RF signal 526 and produces internal RF signal 528. The bias of second RF amplifier 506 can be set by second self-adjusting bias level 527, which can be produced internally to second RF amplifier 506 as shown or which can be produced based on internal RF signal 526 or 528.

Second RF amplifier 506 can be any type of RF amplifier with characteristics suitable for the particular application. In particular, second RF amplifier 506 can be the RF amplifier shown in FIG. 3, or a variation thereof. While the bias adjustment conditioning function in this receiver does not include an op-amp, the position of this amplifier as the second stage within the receiver gives this amplifier stage a higher signal level to work with. Therefore, this second RF stage may be sensitive enough to appropriately adjust its bias without the added cost, complexity and power consumption of an op-amp.

RF to IF converter 507 receives internal RF signal 528 and produces internal IF signal 530. The bias of RF to IF converter 507 can be set by third self-adjusting bias level 529, which can be produced internally to RF to IF converter 507 as shown or which can be produced based on internal RF signal 528 or internal IF signal 530.

RF to IF converter 507 can be any type of RF to IF converter or mixer with characteristics suitable for the particular application.

IF amplifier 508 receives internal IF signal 530 and produces internal IF signal 532. The bias of IF amplifier 508 can be set by fourth self-adjusting bias level 531, which can be produced internally to IF amplifier 508 or which can be produced based on internal RF signal 530 or internal IF signal 532.

IF amplifier 508 can be any type of IF amplifier with characteristics suitable for the particular application. In particular, IF amplifier 508 can be the IF amplifier shown in FIG. 4, or a variation thereof. This IF stage may be sensitive enough to appropriately adjust its bias without the added cost, complexity and power consumption of an op-amp.

Filter 509 receives internal IF signal 532 and produces IF output signal 533. Filter 509 can attenuate out of band components within the signal.

As shown, each active stage in receiver section 551 has its own self adjusting bias level. Substantial reductions in the use of receiver power in some signal environments can be achieved by the embodiment of the invention shown in FIG. 5. For example, to the extent that energy from jamming sources (including but not limited to energy leaked from final power amplifier 503 via duplexer 502) is attenuated by filtering between active stages, then stages after the filtering can operate at reduced bias levels and at reduced power consumption relative to the stages prior to the filtering. Nevertheless, some of the active stages within receiver section 551 could be implemented with fixed bias levels, or with bias levels subject to a common control.

Figure 6:
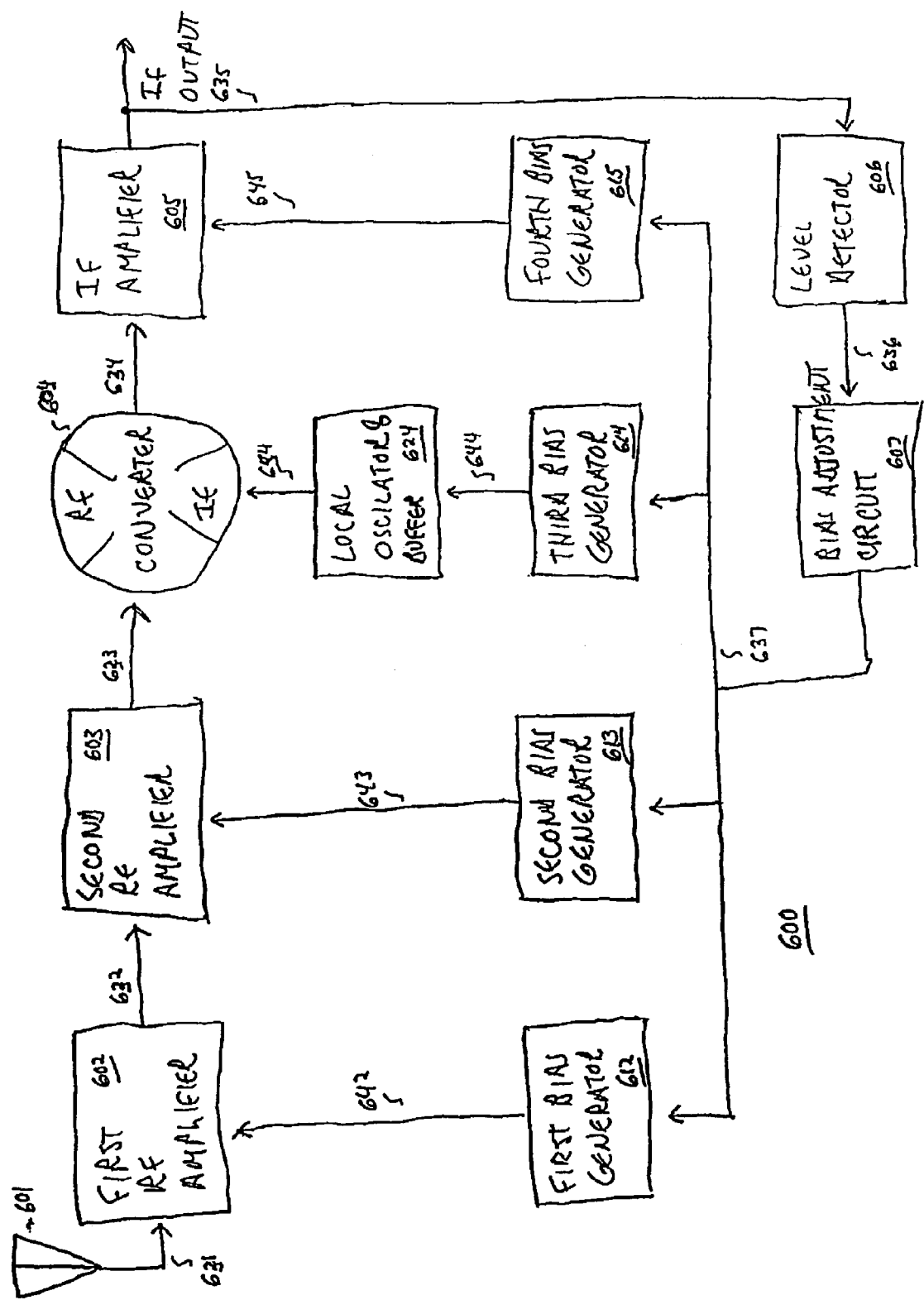
FIG. 6 shows the functional components and their interconnections for another embodiment of the invention. This embodiment is the first stages of a receiver with multiple stages of active circuits such as amplifiers, where the bias level used within each stage is adjusted by a single signal level detector and a single bias adjustment circuit.

FIG. 6 is a functional block diagram of a receiver front end, according to one embodiment of the invention, with multi-stage reactive biasing that has a common control. It differs from the embodiment of the previous figure in that all active stages with reactive biasing operate at the same relative bias level depending on the strength of the current signal environment. It also differs from the previous figure in that the bias level of local oscillator & buffer 608 is adjusted in reaction to signal level.

FIG. 6 is a functional block diagram of receiver front end 600. Receiver front end 600 receives RF input signal 631 from antenna 601 and produces IF output signal 635. As shown, it has five stages of active circuitry, each with reactively adjusted bias. However, other embodiments can have more or fewer active circuit stages, or some of the active circuits can have a fixed rather than a reactively adjusted bias, or some of the active circuits can have a self adjusting bias.

Receiver front end 600 is not a complete receiver; however, the design details of other circuitry required for a specific application of the invention will be easily determined by one skilled in the art. It may include but not be limited to an IF to audio/digital converter, audio/digital amplification/processing, automatic gain control, user interface, and audio input/output.

First RF amplifier 602 amplifies RF input signal 631 into internal RF signal 632. The bias of first RF amplifier 602 can be set by bias level 642, which can be produced by first bias generator 612. First RF amplifier 602 can be any type of RF amplifier with characteristics suitable for the particular application. For example, it can be RF amplifier 201 as shown in FIG. 2(*a*).

Second RF amplifier 603 amplifies internal RF signal 632 (which can be directly as generated by first RF amplifier 602 or after suitable filtering) into internal RF signal 633. The bias of second RF amplifier 603 can be set by bias level 643, which can be produced by second bias generator 613. Second RF amplifier 603 can be any type of RF amplifier with characteristics suitable for the particular application. For example, it can be the RF amplifier shown in FIG. 3.

RF to IF converter 604 converts internal RF signal 633 into internal IF signal 634. RF to IF converter 602 can be any type of RF to IF converter or mixer with characteristics suitable for the particular application.

IF frequency signal 654 can be produced by local oscillator & buffer 624. The bias used in local oscillator & buffer 624 can vary in reaction to the strength of the signal environment in which the receiver is currently operating. The bias level used by local oscillator & buffer 624 can be bias level 644, which can be generated by third bias generator 614.

Local oscillator & buffer 624 can be any type of an oscillator and/or buffer that can produce IF frequency signal 654. In some embodiments, the local oscillator portion produces a signal at the chosen IF frequency, and the active stage that amplifies and/or buffers this IF signal prior to its use in RF to IF converter 604 can use adjustable bias level 644.

Such reactive biasing of the local oscillator & buffer is like the reactive biasing of the RF and IF amplification stages in that it is done in order to save power in typical signal environments, i.e., those in which the extraneous or jamming signals are not as strong as they are under worst-case operating conditions. However, such reactive biasing differs from that of the amplifier stages in that it operates by varying the compression point and perhaps the gain of local oscillator 624, or of the buffer/amplifier stage within local oscillator 624. The design details of local oscillator and buffer 608 will be readily determined by one skilled in the art. In contrast to reactively biased amplification stages, it may be preferable to choose a bias level range and other parameters for local oscillator and buffer 624 such that any change in gain is low or minimal.

IF amplifier 605 amplifies internal IF signal 634 into IF output signal 635. The bias of IF amplifier 605 can be set by bias level 646, which can be produced by fourth bias generator 615. IF amplifier 605 can be any type of IF amplifier with characteristics suitable for the particular application. For example, it can be the IF amplifier shown in FIG. 4.

As shown in FIG. 6, level detector 606 receives IF output signal 625. It detects the signal level of IF output signal 625, and thus indirectly it detects the signal level of RF input signal 631. In other embodiments, level detector 606 can receives a signal that is intermediate between RF input signal 631 and IF output signal 635. According to this signal level, level detector 606 produces bias control signal 636.

Level detector 606 can be any type of circuit that is able to detect changes in the average input and output signal levels that occur over a suitable time frame. In particular, it can be level detector 202 as shown in FIG. 2(*a*) with suitable modifications to adapt the circuit to IF frequencies.

Bias adjustment circuit 607 produces adjusted bias control signal 637 according to bias control signal 636. Bias adjustment circuit 607 can be any circuit that is able to adjust bias control signal 637 in a manner that matches the response of level detector 605 to the bias variation required by the active stages whose bias is being reactively controlled.

For example, bias adjustment circuit 607 can be bias conditioner 205 as shown in FIG. 2(*a*). As other examples, bias adjustment circuit can include circuitry that conditions bias control signal 636, scales it, compares it against a reference level, samples and holds it, sums a held level with a variable level, or any combination of these. It can also include circuitry that monitors feedback on the actual level of one or more of the reactive bias levels so as to provide improved control over bias.

Bias adjustment circuit 708 can also include circuitry that compensates for threshold variations of active devices within the reactive biasing system, including but not limited to variations in the threshold of its field effect transistors (FETs). Because the linear range of a FET may be narrow, it may be important to calibrate or set the levels used so as to maintain the circuit's operation within that linear range.

Alternatively, bias adjustment circuit 607 can be eliminated or simplified. This can apply if level detector 606 has a relatively strong signal (such as an IF signal) to work with and is thus able to produce a bias control signal of a suitable level and range of variation for bias generators 612 through 616 to work with directly.

First bias generator 612 can produce first bias level 632 according to adjusted bias control signal 627 and, optionally, according to a first regulating feedback signal that is internal to first bias generator 612. Similarly, second bias generator 613 can produce second bias level 633 according to adjusted bias control signal 627 and, optionally, a second regulating feedback signal that is internal to second bias generator 613. Similar principles apply to bias generators 614 through 615.

Bias generators 612 through 615 can be any circuits that are able to produce a bias level that varies within a suitable range according to adjusted bias control signal 637 or bias control signal 636. As examples, they can be (as shown in FIG. 2) bias generator 203 using variable resistance 204-A, 204-B or 204-C.

In other embodiments of the invention each bias generator can have a corresponding bias adjustment circuit. Alternatively, two or more bias generators could operate from a first bias adjustment circuit and other bias generators can have one or more other bias adjustment circuit or can directly use bias control signal 636 and thus not need a bias adjustment circuit.

The series of commonly controlled reactively biased amplifiers as shown in FIG. 6 can provide substantial reductions in the use of receiver power in some signal environments. It has fewer components and thus less manufacturing costs, compared with the self-adjusting amplifier stages shown in the previous figure, it has less complexity, and thus is easier to test and less prone to failure. Its only level detector is located after multiple stages of amplification, thus its bias conditioner may not need to include active amplification because it has a relatively strong signal to work with. Also, it may consume less power because of only having one level detector 606, only having one bias adjustment circuit 607 or not requiring amplification to condition the bias control signal.

The amplifier of FIG. 6 may be appropriate where RF or other early filtering is not effective to attenuate jamming signals. This amplifier may also be appropriate for applications where it is undesirable to add the cost, complexity and power consumption of making each stage self adjusting— that is, of having each amplification stage have its own dedicated level detector and perhaps its own dedicated bias adjustment circuit.

One skilled in the art will be easily able to determine the design details of a receiver that is a hybrid of the self-adjusting stages of FIG. 5 and the commonly controlled stages of FIG. 6. For example, one bias control signal could be used for two or more amplifier or other active stages while self-adjusting bias control could be used for other active stages. Further, such a multi-stage receiver could also include active stages with fixed bias levels.

Figure 7:
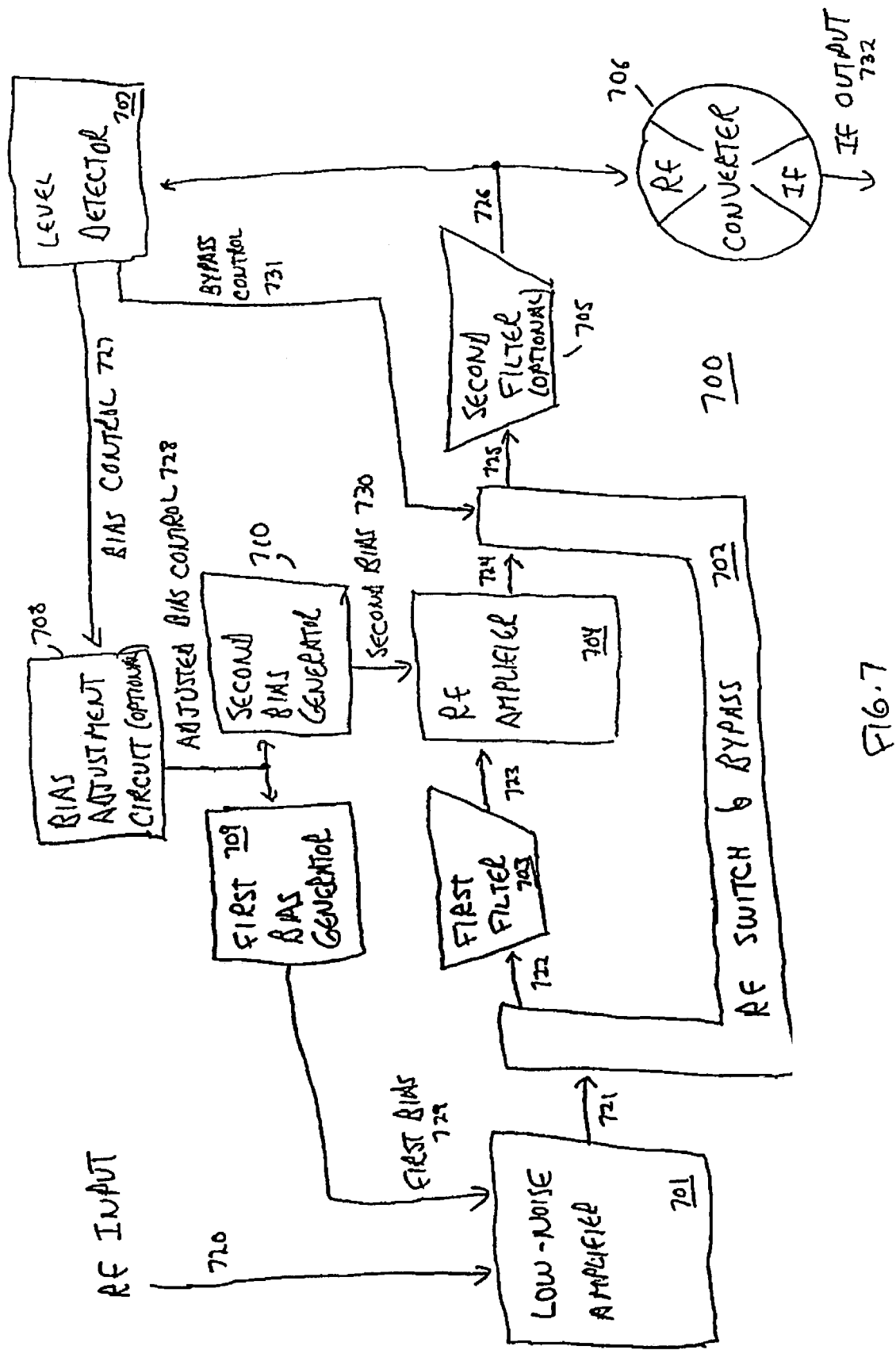
FIG. 7 shows the functional components and their interconnections for another embodiment of the invention. This embodiment is the first stages of a receiver in which a first filter and an RF amplifier are optionally included in the receiver's signal path or switched out of it.

FIG. 7 is a functional block diagram, according to one embodiment of the invention, of receiver front end 700 in which both a filter and an RF amplifier are optionally included in the receiver's signal path or switched out of it. Receiver front end 700 receives RF input signal 720 and produces IF output signal 732.

As shown, receiver front end 700 has two stages of active circuitry, each with a reactively adjusted bias under common control, and one switch. However, other embodiments can have more switches, more or fewer active circuit stages, or some of the active circuits can have a fixed rather than a reactively adjusted bias, or some of the active circuits can have a self adjusting bias.

Low noise amplifier 701 amplifies RF input signal 720 into first internal RF signal 721. The bias of low noise amplifier 701 can be set by first bias level 729, which can be produced by first bias generator 709. Low noise amplifier 701 can be any type of RF amplifier with characteristics suitable for the particular application. For example, it can be RF amplifier 201 as shown in FIG. 2(a).

RF switch and bypass circuit 702 receives first internal RF signal 721 and produces switched RF signal 725. When in bypass mode, i.e. when bypass control signal 731 is asserted, switched RF signal 725 is substantially first internal RF signal 721, though some switching loss may occur within RF switch and bypass circuit 702. When bypass control signal 731 is not asserted, switched RF signal 725 can be the result of filtering first internal RF signal 721 by first filter 703 and amplifying the result by RF amplifier 704. Alternatively, switched RF signal 725 can be the result of amplifying first internal RF signal 721 by RF amplifier 704 and filtering the result by first filter 703.

RF switch and bypass circuit 702 can be any circuit able to transfer either first internal RF signal 721 or fourth internal RF signal 724 to switched RF signal 725. Further, it is preferably a circuit able to transfer first internal RF signal 721 to either second internal RF signal 722 or to switched RF signal 725 but not to both, so as to not unnecessarily load first internal RF signal 721 when operating in bypass mode.

First filter 703 receives second internal RF signal 722 from RF switch and bypass circuit 702 and produces third internal RF signal 723. First filter 703 can be any circuit able to reduce undesired or jamming components of second RF signal 722. In some embodiments, receiver front end 700 is used in a transceiver device and first filter 703 is a transmission blocking filter.

RF amplifier 704 amplifies third internal RF signal 723 into fourth internal RF signal 724. The bias of second RF amplifier 704 can be set by second bias level 730, which can be produced by second bias generator 710. Second RF amplifier 704 can be any type of RF amplifier with characteristics suitable for the particular application. For example, it can be the RF amplifier shown in FIG. 3.

In some embodiments of the invention, second filter 705 receives switched RF signal 725 from RF switch and bypass circuit 702 and produces fifth internal RF signal 726. In other embodiments, there is no second filter and switched RF signal 725 is directly provided to RF to IF converter 706 and level detector 707. Second filter 705 can be any circuit able to reduce undesired or jamming components of switched RF signal 724. In some embodiments, receiver front end 700 is used in a transceiver device and second filter 705 is a transmission blocking filter.

RF to IF converter 706 converts fifth internal RF signal 726, or switched RF signal 725, into internal IF output signal 732. RF to IF converter 726 can be any type of RF to IF converter or mixer with characteristics suitable for the particular application.

As shown in FIG. 7, level detector 707 receives fifth internal RF signal 726, or switched RF signal 725. It detects the signal level of this signal, and thus indirectly it detects the signal level of RF input signal 720. In other embodiments, level detector 707 can receive a signal that is intermediate between RF input signal 720 and switched RF signal 725, or it can receive IF output signal 732. According to this signal level, level detector 707 produces bias control signal 727 and bypass control signal 731.

Level detector 707 can be any type of circuit that is able to detect changes in the average input and output signal levels that occur over a suitable time frame. In particular, bias control signal 727 can be generated by level detector 202 as shown in FIG. 2(a), and bypass control signal 731 can be generated by comparing bias control signal 727 against a threshold.

Bias adjustment circuit 708 produces adjusted bias control signal 728 according to bias control signal 727. Bias adjustment circuit 708 can be any circuit that is able to adjust bias control signal 637 in a manner that matches the response of level detector 707 to the bias variation required by the active stages whose bias is being reactively controlled.

For example, bias adjustment circuit 708 can be bias conditioner 205 as shown in FIG. 2(a). As other examples, bias adjustment circuit can include circuitry that conditions bias control signal 727, scales it, compares it against a reference level, samples and holds it, sums a level held with a variable level, or any combination of these. It can also include circuitry that monitors feedback on the actual level of one or more of the reactive bias levels so as to provide improved control over bias.

Bias adjustment circuit 708 can also include circuitry that compensates for threshold variations of active devices within the reactive biasing system, including but not limited to variations in the threshold of its field effect transistors (FETs). Because the linear range of a FET may be narrow, it may be important to calibrate or set the levels used so as to maintain the circuit's operation within that linear range.

Alternatively, bias adjustment circuit 708 can be eliminated or simplified. This can apply if level detector 707 has a relatively strong signal (such as an IF signal) to work with and is thus able to produce a bias control signal of a suitable level and range of variation for bias generators 709 and 710 to work with directly.

First bias generator 709 can produce first bias level 729 according to adjusted bias control signal 728 and, optionally, according to a first regulating feedback signal that is internal to first bias generator 709. Similarly, second bias generator 710 can produce second bias level 730 according to adjusted bias control signal 728 and, optionally, a second regulating feedback signal that is internal to second bias generator 710.

Bias generators 709 and 710 can be any circuits that are able to produce a bias level that varies within a suitable range according to adjusted bias control signal 728 or bias control signal 727. As examples, they can be (as shown in FIG. 2) bias generator 203 using variable resistance 204-A, 204-B or 204-C.

In other embodiments of the invention each bias generator can have a corresponding bias adjustment circuit.

Code division multiple access (CDMA) receivers can include a receiver chain that includes a low-noise amplifier (LNA) that can be bypassed by a switch, followed by a transmission rejection filter, followed by an RF amplifier that can be bypassed by a switch.

In cellular phone applications, it is important that the volume level the user perceives not vary with signal strength. To meet this need, the gain of the receiver chain, and sometimes the gain of the subsequent demodulation and audio amplification, can be relatively precisely calibrated by digitizing a signal that represents the current signal strength into an 8-bit signal strength value representing, for example, signal strengths ranging from −106 to −21 dBm. This signal strength value can be used as an index into a lookup table, each entry of which represents a calibration factor that is used to control the gain. Such a lookup table apparatus is called a "linearizer" because it corrects for the non-linearity of the automatic gain control (AGC) level versus the received signal strength level.

When one of the amplifiers in the receiver chain is bypassed, the linearizer curve should be shifted by the change in gain due to bypassing the amplifier. To continue with the above example, bypassing an amplifier results in the low end of the linearizer curve shifting from −106 dBm to −106 plus the change in gain.

This change in gain can be estimated as follows: Each amplifier can have a gain of, for example, 15 to 16 dB. There can be some loss in the bypass path, for example 0.5 dB or more. Also, there is typically 1 dB uncertainty in the calibration process, which should be added here as margin. This results in the end of linearizer curve being −106+15.5+0.5+1=−89 dBm.

A proposed extended jamming signal test calls for a desired signal having a strength of −90 dBm that is concurrent with a two-tone jamming signal having a signal strength of −32 dBm for each tone.

This test can present a problem for the receiver if it is unable to operate with one of the amplifiers bypassed. Specifically, the linearity or $IIP^3$ of the RF amplifier must be significantly higher than if the RF amplifier is bypassed at the operating point (i.e. signal strength) corresponding to this test.

Qualitatively, not only does the second amplifier contribute its own non-linearity to the chain, it amplifies the undesirable effects of the non-linearity of the first amplifier. Quantitatively, this difference in $IIP^3$ can be required can be roughly estimated as equivalent to the gain that could be bypassed.

However, bypassing either the LNA or the RF amplifier can present a problem if the operating point of interest falls off the linearizer; that is, if there is no entry in the look-up table for the corresponding digital strength value.

A first approach to dealing with this problem of is to automatically put back in the gain, i.e. switch back in the amplifier. This raises the received signal back into the range where the linearizer can compensate for non-linearity at the operating point of interest. This approach prevents the receiver from operating with either of its amplification stages bypassed when such operation would result in the digitized signal strength being below the end of the linearizer table.

A drawback of this first approach is that having both amplifiers switched in can significantly increase the linearity requirement that the second amplifier must meet, as discussed above.

An second approach is to move the transmission rejection filter into the bypass path. Using this architecture, the point at which one of the amplifiers is switched in and out, i.e. the bypass point, can be lowered to the insertion loss of this filter, which can be about 2 dB, for example. This can allow the bypass point to be about −91 dBm. Such a bypass point can be less than the −90 dBm extended jamming signal test described above.

Using the second approach can facilitate the goal of switching out one of the amplifiers for this test. That is, bypassing the filter allows the $IIP^3$ of the second stage amplifier to be significantly lower.

Another advantage of the second approach, and of the lower bypass point that it enables, is that in actual operation of the receiver one of the amplifiers is likely to be bypassed for a greater portion of the operating time. The power consumed by the amplifier can be reduced or eliminated when it is unused. This can further save power and prolong battery life.

TABLE 4

Breakdown of IS-95 J-STD-018 CDMA RX inter-modulation performance specs

| input CDMA level (dBm) | input tone level (dBm) | # of tones |
|---|---|---|
| −101 | −30 | 1 |
| −101 | −43 | 2 |
| −90 | −32 | 2 |
| −79 | −21 | 2 |

In the following table, the RF amplifier state is decided upon the CDMA signal level being above or below the switch point. Case 1 is a switch point less than −90, Case 5 is a switch point greater than −90 dBm.

TABLE 5

Breakdown of IS-95 J-STD-018 CDMA RX inter-modulation performance specs

| Case | input CDMA level (dBM) | input tone level (dBm) | RF Amp State |
|---|---|---|---|
| 1 | −90 | −32 | bypassed |
| 2 | −101 | −43 | engaged |
| 3 | −79 | −21 | bypassed |
| 4 | −101 | −30 | engaged |
| 5 | −90 | −32 | engaged |

The following table is generated by considering the input level upon each device given. 3 dB insertion loss and 50 dB transmission rejection was used for the duplexer. 2 dB insertion loss and 25 dB transmission rejection was used for the transmission rejection filter. $IIP^3$ can be calculated by the well known formula $IIP3=\frac{1}{2}(3*\text{Tone level}-\text{Intermodulation product level})$. $IIP^3$'s were calculated for an intermodulation product level marginally acceptable for demodulation of the CDMA signal. $IIP^3$ for cross-modulation with the transmission leakage and a single-tone is a phenomena best predicted by measurement and simulation. In some cases both inter-modulation and cross-modulation contribute to raise the required $IIP^3$ greater than one type alone. Gain used for the LNA was 16 dB, 15 dB for the RF amplifier, and 1 dB loss for the switches. Detector levels are increased by 3 dB in the cases of two equal level jamming tones contributing.

TABLE 6

Linearity requirements for each of the stages vs cases and detector level (all levels dBm)

| Case | LNA IIP3 | RF Amp IIP3 | Mixer IIP3 | Detector level |
|------|----------|-------------|------------|----------------|
| 1 | −4.5 | Bypassed | 10.5 | −15.5 |
| 2 | 1.5 | −2.7 | 12.3 | −13.2 |
| 3 | 3.5 | Bypassed | 18.5 | −6 |
| 4 | 8.0 | −1.0 | 14.0 | −3.9 |
| 5 | −4.5 | 6.5 | 21.5 | −3.0 |

It is evident that not bypassing the RF amplifier in Case 5 creates a much higher demand for $IIP^3$ from the RF amplifier and the mixer. The second highest demand for the mixer comes from Case 3 in which cross-modulation from the transmitter plays no part, which shows there was no performance degradation due to having the transmission reject filter in the bypass path.

Figure 8:
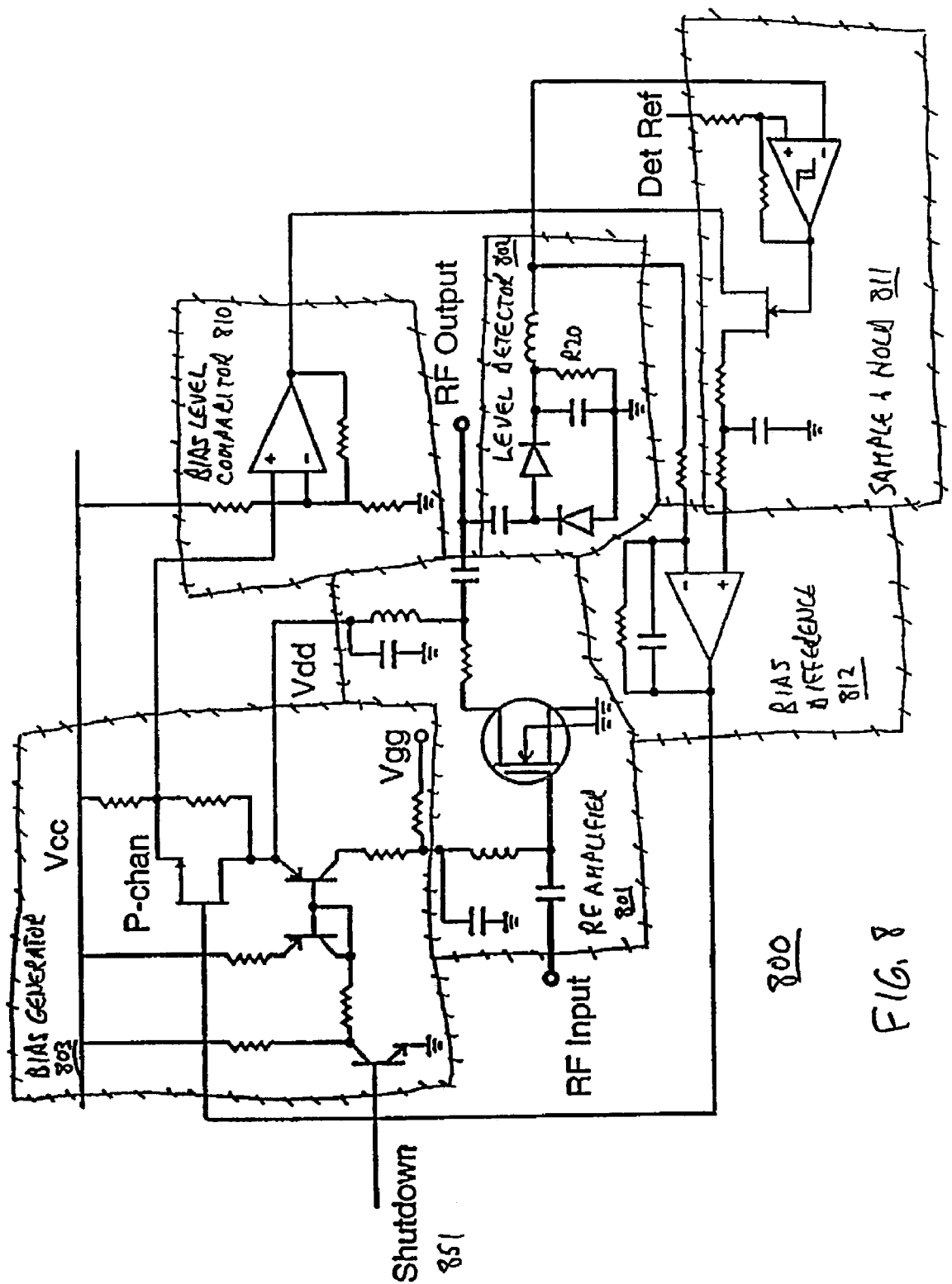
FIG. 8 shows electronic circuit components and their interconnections that can be used to make another embodiment of the invention that uses a sample and hold circuit that can improve the accuracy of the reactive bias function by compensating for variations in the threshold of circuit components.

FIG. 8 is a circuit diagram for an embodiment of the invention that uses a sample and hold circuit to improve the accuracy and effectiveness of the reactive bias function by compensating for variations of circuit components, operating conditions or both. These variations include but are not limited to variations in the thresholds of the field effect transistors (FETs) used. The range of linear operation of a FET can be narrow and its threshold voltage (and thus the point at which it does operate linearly) can be affected by manufacturing tolerances, temperature variations or voltage fluctuations. Thus, it can be advantageous to dynamically compensate for such variations, particularly when done as the same time as dynamically compensating for the signal strength of the receiver's current operating environment.

In the example circuit diagram of FIG. 8, RF amplifier 801 can be equivalent or identical to RF amplifier 201 as shown in FIG. 2. Detector 802 can be a minor variation (i.e. adding R20) from detector 202 as shown in the same figure.

The function of bias generator 803 is similar to that of bias generator 203 as shown in the same figure, but it alters the bias of RF amplifier 201 by changing the bias current level, while the bias voltage level remains substantially constant. To implement this, the variable resistance circuit within bias generator 803 is moved to the bottom portion of bias generator 803. Another difference is that in bias generator 803 when shutdown signal 851 is asserted, all bias voltage and current is shut off to RF amplifier 801.

These variations between bias generator 203 and 803 are independent of the threshold compensation feature of receiver 800; a threshold compensating receiver could be designed using bias generator 203 or a range of similar circuits.

The bias adjustment function is performed by bias level comparitor 810, sample and hold circuit 811 and bias difference circuit 812.

Bias level comparitor 810 can be any type of circuit that is able to generate regulating feedback signal 842. In particular, regulating feedback signal 842 can be generated by comparing a reference voltage against a signal internal to bias generator 803. In the embodiment shown, the reference voltage is formed by a two resistor voltage divider between Vcc and ground, which helps compensate for variations in Vcc.

Sample and hold circuit 811 can be any type of circuit that is able to sample regulating feedback signal 842 when the signal environment in which the receiver is sufficiently quiescent, and hold that signal value when the signal environment is stronger. In the embodiment shown, when bias control signal 840 is below a threshold set by detector reference signal 850 then the current value of regulating feedback signal 842 is sampled or transferred onto capacitor C20, and when above then the value is held on C20.

Bias difference circuit can be any type of circuit that appropriately adjusts bias control signal 840 into adjusted bias control value 841. The adjustments can include but are not limited to generating the difference between bias control signal 840 and the value being sampled via capacitor C20 or held on capacitor C20.

Figure 9:
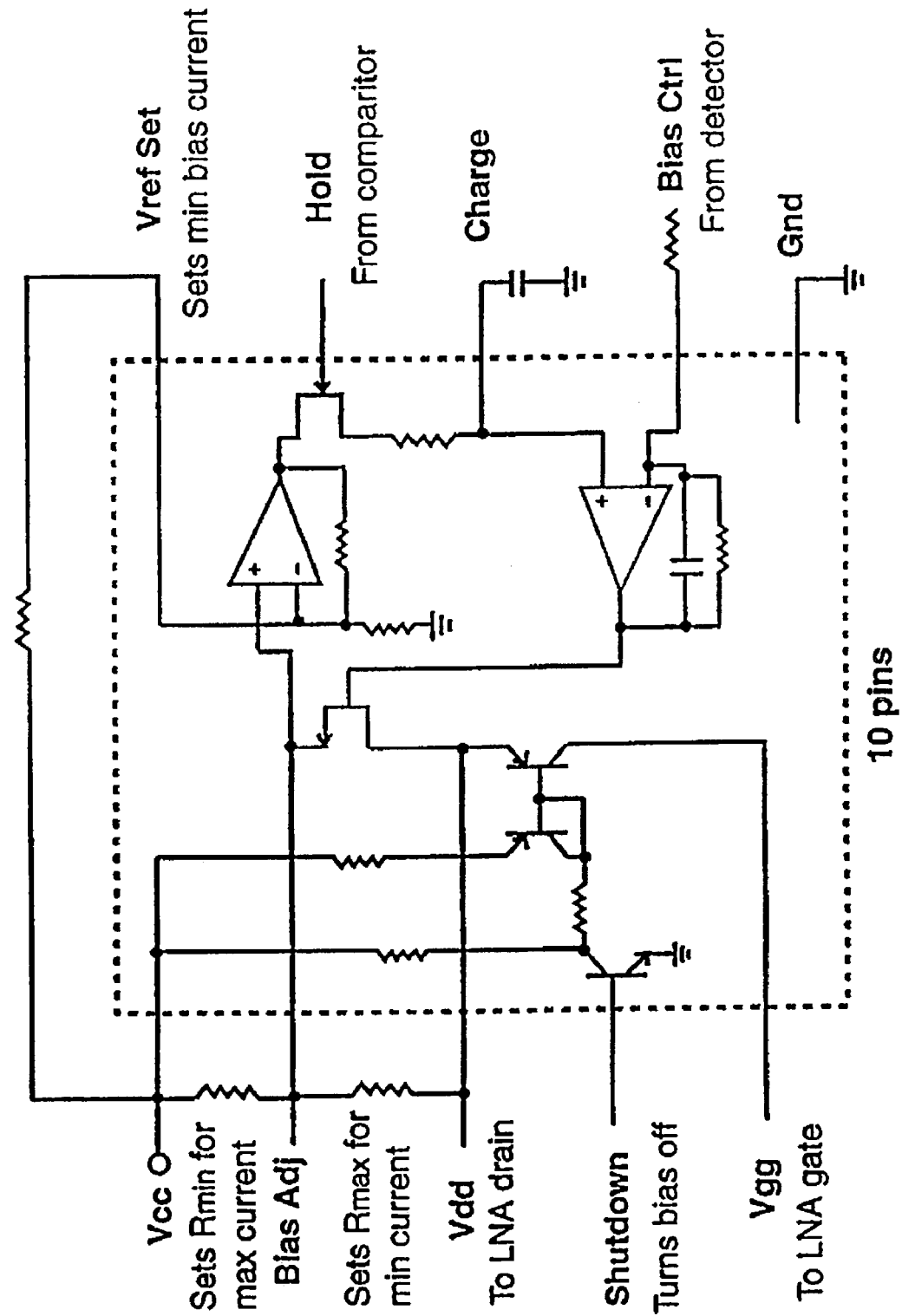
FIG. 9 shows how one embodiment of the invention can be made with many of its electronic circuit components formed using a single integrated circuit with 10 pins.

FIG. 9 is a circuit diagram and an pin out diagram of an application specific integrated circuit (ASIC) for bias control according to one embodiment of the invention. As shown, many of the electronic circuit components of FIG. 8 are formed within a single integrated circuit having 10 pins. Implementing these circuit components as an ASIC can reduce manufacturing costs and complexity of receivers that use reactively biased front end circuits.

It will be obvious to one skilled in the art that there are numerous other selections of what circuit components within FIG. 8, or within another embodiment of the invention, can be integrated. For example, an 8 pin embodiment can be designed that omits the Bias Adjustment and Shutdown signal pins.

Figure 10:
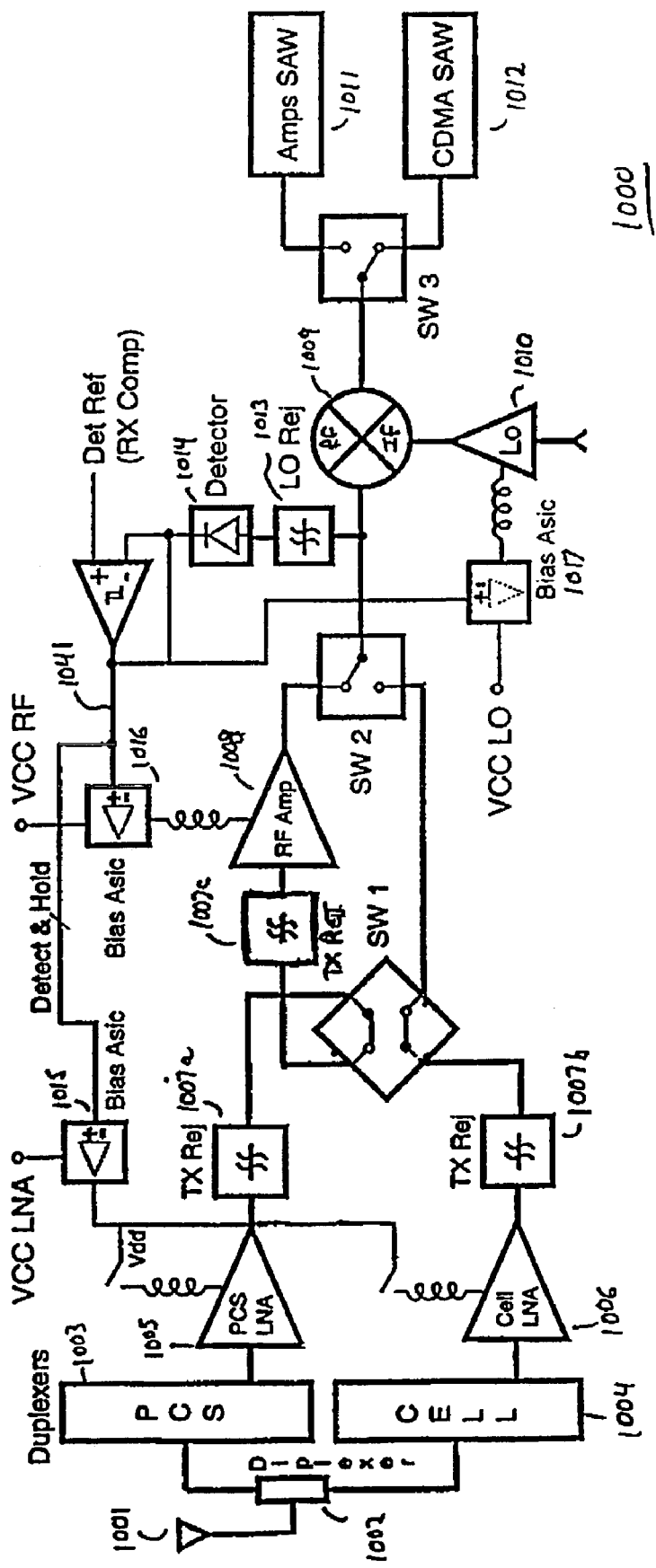
FIG. 10 shows the functional components and their interconnections for another embodiment of the invention. This embodiment is the first stages of a receiver that uses the integrated circuit of the previous figure to build a receiver that can be operated in several modes used in mobile telephone applications. These modes include analog modes such as cellular and advanced mobile phone service (AMPS) as well as digital modes such as code division multiple access (CDMA) and personal communication service (PCS).

FIG. 10 shows the functional components and their interconnections for another embodiment of the invention. This embodiment is the first stages of a receiver that uses the integrated circuit of the previous figure to build a receiver that can be operated in several modes used in mobile telephone applications. These modes include analog modes such as cellular and advanced mobile phone service (AMPS) as well as digital modes such as code division multiple access (CDMA) and personal communication service (PCS).

Reactively biased front end circuits according to the present invention can be used within various types of mobile telephone receivers, as can switching in and out the transmission rejection filter when the second stage RF amplifier is switched in and out.

In the example shown in FIG. 10, antenna 1001 provides, via diplexer 1002, an RF signal to both PCS duplexer 1003 and cellular duplexer 1004. PCS duplexer 1003 and cellular duplexer 1004 respectively provide RF signals to PCS low noise amplifier (LNA) 1005 and cellular LNA 1006. They in turn respectively provide RF signals to optional transmission rejection filters 1007a and 1007b, which in turn provide RF signals to switch SW1.

SW1 determines whether the RF signal currently of interest (e.g. PCS or cellular) passes through transmission rejection filter 1007c and second stage RF amplifier 1008 prior to going on to switch SW2. Transmission rejection filter 1007c, which is optional, is a dual band filter, in that its filtering applies to both cellular and PCS signals.

Switch SW2, in conjunction with SW1, selects the signal of interest and passes it on to RF to IF converter 1009. Local oscillator 1010 provides the intermediate frequency signal to RF to IF converter 1009.

Switch SW3 routes the output of RF to IF converter 1003 on either to AMPS SAW filter 1011 or to CDMA SAW filter 1012

Local oscillator rejection filter 1013 attenuates the local oscillator signal from entering level detector 1014. Level detector 1014 produces detect and hold signal 1041. Bias ASICs 1015 to 1017 use detect and hold signal 1041 to generate the bias levels for their respective active circuits.

The bias of PCS low noise amplifier 1005 and of cellular amplifier 1006 is reactively set by bias ASIC 1011 according to detect and hold signal 1041. The bias of second stage RF amplifier 1008 is reactively set by bias ASIC 1016 according to detect and hold signal 1041. Similarly, the bias of local oscillator 1010 is reactively set by bias ASIC 1017 according to detect and hold signal 1041.

One skilled in the art will be easily able to determine how stages and circuits within the front end of a receiver other than those expressly discussed herein could be designed with reactive biasing in accordance with the principles, spirit and scope of the invention.

As illustrated herein, the invention provides a novel and advantageous method and apparatus for the front-end stages of a receiver with reactively biased amplification, oscillation and other circuits to provide low power, high linearity and low intermodulation. One skilled in the art will recognize that one may employ various embodiments of the invention, alternative designs for the invention and changes in its form and detail. In particular, the circuits shown in FIGS. 2, 3, 4, 8 and 9 may be simplified, augmented or changed in various embodiments of the invention. Also, the amplifiers of FIGS. 5, 6, 7 and 10 may be intermixed, extended to more stages, simplified, augmented or changed.

Such changes and other changes do not depart from the principles or spirit of the invention, the scope of which is set forth in the following claims.

What is claimed is:

1. A multi-stage radio frequency receiver that amplifies an input signal into an output signal, comprising:
    a first amplification means, having a self-adjusted bias level, for amplifying a radio frequency input signal into a internal signal;
    a second amplification means, having a self-adjusted bias level, for amplifying the internal signal into the output signal; and
    a switch configured to pass one of the internal signal and the internal signal further processed by an additional processing means to the second amplification means.

* * * * *

UNITED STATES PATENT AND TRADEMARK OFFICE
CERTIFICATE OF CORRECTION

| | | |
|---|---|---|
| PATENT NO. | : 7,248,653 B2 | Page 1 of 1 |
| APPLICATION NO. | : 10/409298 | |
| DATED | : July 24, 2007 | |
| INVENTOR(S) | : Wieck | |

It is certified that error appears in the above-identified patent and that said Letters Patent is hereby corrected as shown below:

In the CLAIMS:

Claim 1, column 24, line 11, delete "self-adjusted" and insert --self-adjusting--.

Claim 1, column 24, line 13, delete "a" and insert --an--.

Signed and Sealed this

Eighth Day of July, 2008

JON W. DUDAS
*Director of the United States Patent and Trademark Office*